(12) United States Patent
Nomachi et al.

(10) Patent No.: US 9,780,104 B2
(45) Date of Patent: Oct. 3, 2017

(54) SEMICONDUCTOR MEMORY DEVICE AND METHOD OF MANUFACTURING THE SAME

(71) Applicant: Toshiba Memory Corporation, Minato-ku (JP)

(72) Inventors: Akiko Nomachi, Yokkaichi (JP); Hisashi Kato, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/071,445

(22) Filed: Mar. 16, 2016

(65) Prior Publication Data

US 2017/0077113 A1     Mar. 16, 2017

Related U.S. Application Data

(60) Provisional application No. 62/216,903, filed on Sep. 10, 2015.

(51) Int. Cl.
| | |
|---|---|
| H01L 27/115 | (2017.01) |
| H01L 23/528 | (2006.01) |
| H01L 23/522 | (2006.01) |
| H01L 21/768 | (2006.01) |
| H01L 27/11556 | (2017.01) |
| H01L 27/11582 | (2017.01) |
| H01L 27/11573 | (2017.01) |
| H01L 27/11575 | (2017.01) |

(52) U.S. Cl.
CPC .. *H01L 27/11556* (2013.01); *H01L 21/76877* (2013.01); *H01L 21/76895* (2013.01); *H01L 23/528* (2013.01); *H01L 23/5226* (2013.01); *H01L 27/11573* (2013.01); *H01L 27/11575* (2013.01); *H01L 27/11582* (2013.01)

(58) Field of Classification Search
CPC .................. H01L 27/11556; H01L 23/5226
USPC ........................................................ 257/774
See application file for complete search history.

(56) References Cited

U.S. PATENT DOCUMENTS

| | | | |
|---|---|---|---|
| 7,679,133 | B2 | 3/2010 | Son et al. |
| 8,372,720 | B2 | 2/2013 | Fukuzumi et al. |
| (Continued) | | | |

FOREIGN PATENT DOCUMENTS

| | | |
|---|---|---|
| JP | 2009-117843 | 5/2009 |
| JP | 2009-146954 | 7/2009 |
| JP | 2011-151316 | 8/2011 |

*Primary Examiner* — Moazzam Hossain
(74) *Attorney, Agent, or Firm* — Oblon, McClelland, Maier & Neustadt, L.L.P.

(57) ABSTRACT

An embodiment includes: a semiconductor substrate, a memory cell array region including a plurality of conductive layers connected to memory cells arranged in a stacking direction on the semiconductor substrate; a peripheral region including a transistor on the substrate; a plurality of first layers and second layers stacked alternately in the stacking direction, above the transistor; and a plurality of first contacts penetrating the plurality of first and second layers and connected to the transistor. The plurality of first layers and second layers are stacked alternately in the stacking direction, above the transistor disposed in the peripheral region. A plurality of contacts penetrating the plurality of first layers and second layers are connected to the transistor. Moreover, the first layer mainly contains a different material from the second layer.

9 Claims, 26 Drawing Sheets

(56) References Cited

U.S. PATENT DOCUMENTS

| | | | |
|---|---|---|---|
| 8,405,141 B2 | 3/2013 | Matsuda et al. | |
| 2008/0173932 A1* | 7/2008 | Kidoh | H01L 27/11568 |
| | | | 257/324 |
| 2009/0310425 A1* | 12/2009 | Sim | H01L 27/11526 |
| | | | 365/185.29 |
| 2010/0213526 A1* | 8/2010 | Wada | H01L 21/76808 |
| | | | 257/314 |
| 2011/0220987 A1* | 9/2011 | Tanaka | H01L 27/11575 |
| | | | 257/324 |
| 2013/0051126 A1* | 2/2013 | Kwong | H01G 4/30 |
| | | | 365/149 |
| 2013/0056818 A1* | 3/2013 | Iino | H01L 27/1157 |
| | | | 257/324 |
| 2013/0161821 A1* | 6/2013 | Hwang | H01L 23/5283 |
| | | | 257/773 |
| 2014/0061748 A1* | 3/2014 | Lee | H01L 29/78 |
| | | | 257/314 |
| 2015/0162343 A1* | 6/2015 | Park | H01L 27/11582 |
| | | | 257/329 |
| 2015/0340374 A1* | 11/2015 | Jung | H01L 27/11573 |
| | | | 438/258 |

* cited by examiner

SEMICONDUCTOR MEMORY DEVICE AND METHOD OF MANUFACTURING THE SAME

CROSS REFERENCE TO RELATED APPLICATION

This application is based upon and claims the benefit of priority from U.S. Provisional Patent Application No. 62/216,903, filed on Sep. 10, 2015, the entire contents of which are incorporated herein by reference.

FIELD

Embodiments described herein relate to a semiconductor memory device and a method of manufacturing the same.

BACKGROUND

A flash memory that stores data by accumulating a charge in a charge accumulation layer or floating gate, is known. Such a flash memory is connected by a variety of systems such as NAND type or NOR type, and configures a semiconductor memory device.

In recent years, increasing of capacity and raising of integration level of such a semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment includes: a semiconductor substrate, a memory cell array region including a plurality of conductive layers connected to memory cells arranged in a stacking direction on the semiconductor substrate; a peripheral region including a transistor on the semiconductor substrate; a plurality of first layers and second layers stacked alternately in the stacking direction, above the transistor; and a plurality of first contacts penetrating the plurality of first and second layers and connected to the transistor. Moreover, the first layer mainly contains a different material from the second layer.

Next, semiconductor memory devices according to embodiments will be described in detail with reference to the drawings. Note that these embodiments are merely examples. For example, the semiconductor memory devices described below have a structure in which a memory string extends linearly in a perpendicular direction to a substrate, but a similar structure may be applied also to a U-shaped structure in which the memory string is doubled back on an opposite side midway. Moreover, each of the drawings of the semiconductor memory devices employed in the embodiments below is schematic, and thicknesses, widths, ratios, and so on, of layers are not necessarily identical to those of the actual semiconductor memory devices.

In addition, the embodiments described below relate to semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor film acting as a channel provided in a column shape perpendicularly to a substrate; and a gate electrode film provided on a side surface of the semiconductor film via a charge accumulation layer. However, a similar structure may be applied also to a memory cell of another form, for example, a SONOS (Semiconductor-Oxide-Nitride-Oxide-Semiconductor) type memory cell or MANOS (Metal-Aluminum Oxide-Nitride-Oxide-Semiconductor) type memory cell, one employing hafnium oxide ($HfO_x$) or tantalum oxide ($TaO_x$) as an insulating layer, or a floating gate type memory cell.

First Embodiment

Figure 1:
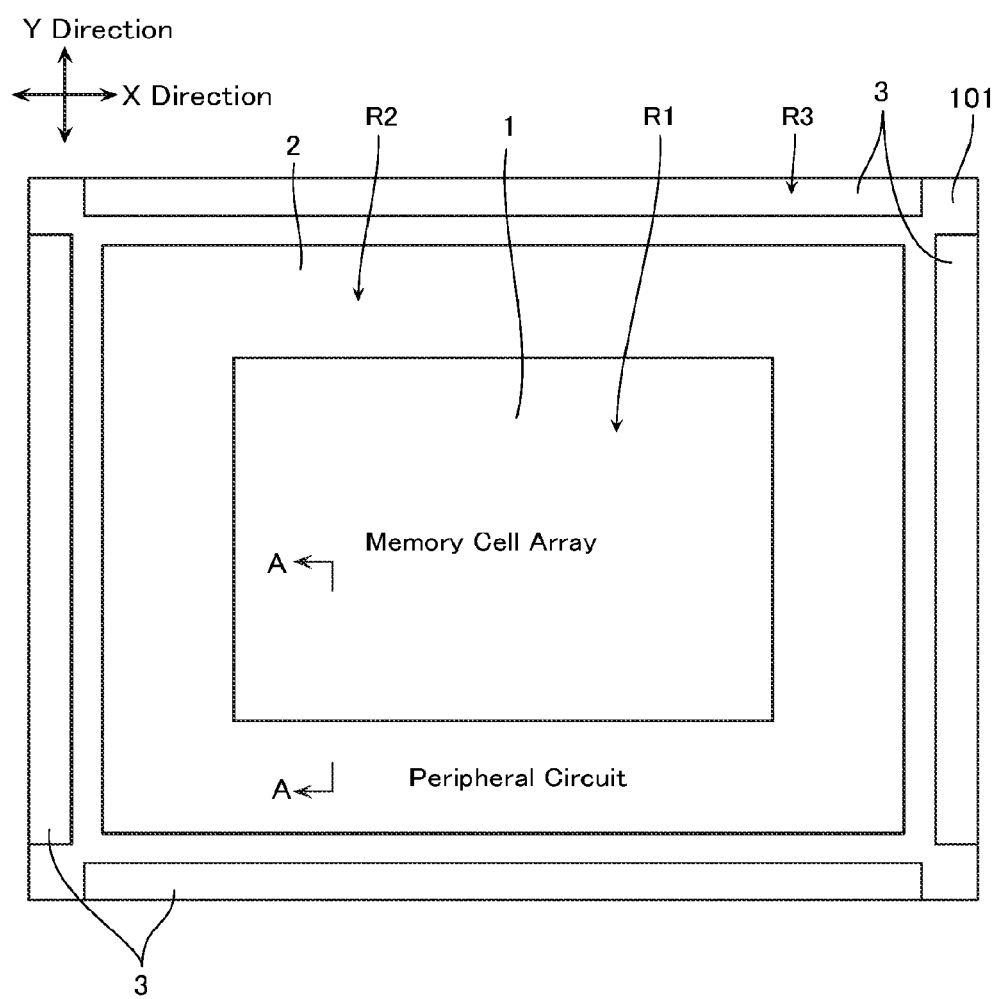
FIG. 1 is a plan view showing a schematic configuration of a semiconductor memory device according to a first embodiment.

FIG. 1 is a plan view showing a schematic configuration of a semiconductor memory device according to a first embodiment. The semiconductor memory device according to the first embodiment comprises a memory cell array 1 and a peripheral circuit 2 that are provided on a substrate 101 used as a memory chip. A periphery of the peripheral circuit 2 may be provided with a dummy stepped portion 3.

The memory cell array 1 comprises: a plurality of memory cells arranged three-dimensionally; and a stepped portion where wiring lines led out from the memory cells are formed in steps.

The peripheral circuit 2 is connected to the memory cell array 1 via a plurality of bit lines and a plurality of word lines. The peripheral circuit 2 is configured from a CMOS circuit provided on the substrate 101, and functions as a decoder, a sense amplifier, a state machine, a voltage generating circuit, and so on.

Note that in the description below, a region on the substrate 101 provided with the memory cell array 1 will be called a memory cell array region R1, and a region on the substrate 101 provided with the peripheral circuit 2 will be called a peripheral circuit region R2 (transistor region).

Figure 2:
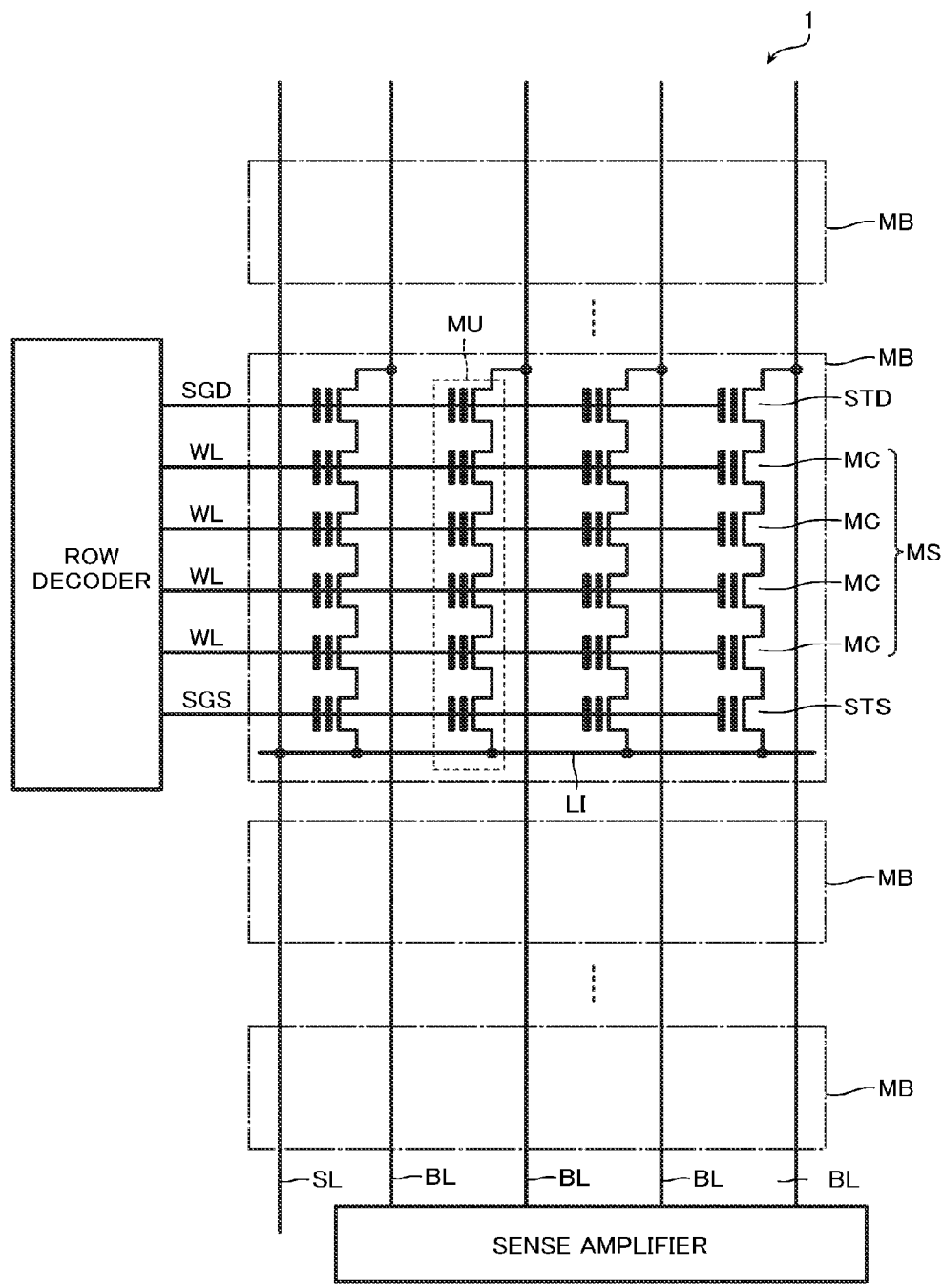
FIG. 2 is an equivalent circuit diagram showing a configuration of a memory cell array 1 of the same semiconductor memory device.

Next, a circuit configuration of part of the memory cell array 1 according to the present embodiment will be described with reference to FIG. 2. FIG. 2 is an equivalent circuit diagram showing a configuration of part of the memory cell array 1 according to the present embodiment.

As shown in FIG. 2, the memory cell array 1 according to the present embodiment comprises a plurality of memory blocks MB. Moreover, commonly connected to these plurality of memory blocks MB are a plurality of the bit lines BL and a source line SL. Each of the memory blocks MB is connected to the sense amplifier via the bit lines BL, and is connected to an unillustrated source line driver via the source line SL.

The memory block MB comprises a plurality of memory units MU that have their one ends connected to the bit lines BL and have their other ends connected to the source line SL via a source contact LI.

As shown in FIG. 2, the memory unit MU comprises a plurality of the memory cells MC connected in series. As will be mentioned later, the memory cell MC comprises a semiconductor layer, a charge accumulation layer, and a control gate, and accumulates a charge in the charge accumulation layer based on a voltage applied to the control gate, thereby changing a threshold value of the memory cell MC. Note that hereafter, the plurality of memory cells MC connected in series will be called a "memory string MS".

As shown in FIG. 2, commonly connected to the control gates of pluralities of the memory cells MC configuring different memory strings MS are, respectively, the word lines WL. These pluralities of memory cells MC are connected to the row decoder via the word lines WL.

As shown in FIG. 2, the memory unit MU comprises a drain side select gate transistor STD connected between the memory string MS and the bit line BL. Connected to a control gate of the drain side select gate transistor STD is a drain side select gate line SGD. The drain side select gate line SGD is connected to the row decoder, and selectively connects the memory string MS and the bit line BL based on an inputted signal.

As shown in FIG. 2, the memory unit MU comprises a source side select gate transistor STS connected between the memory string MS and the source contact LI. Connected to a control gate of the source side select gate transistor STS is a source side select gate line SGS. The source side select gate line SGS is connected to the row decoder, and selectively connects the memory string MS and the source line SL based on an inputted signal.

Figure 3A:
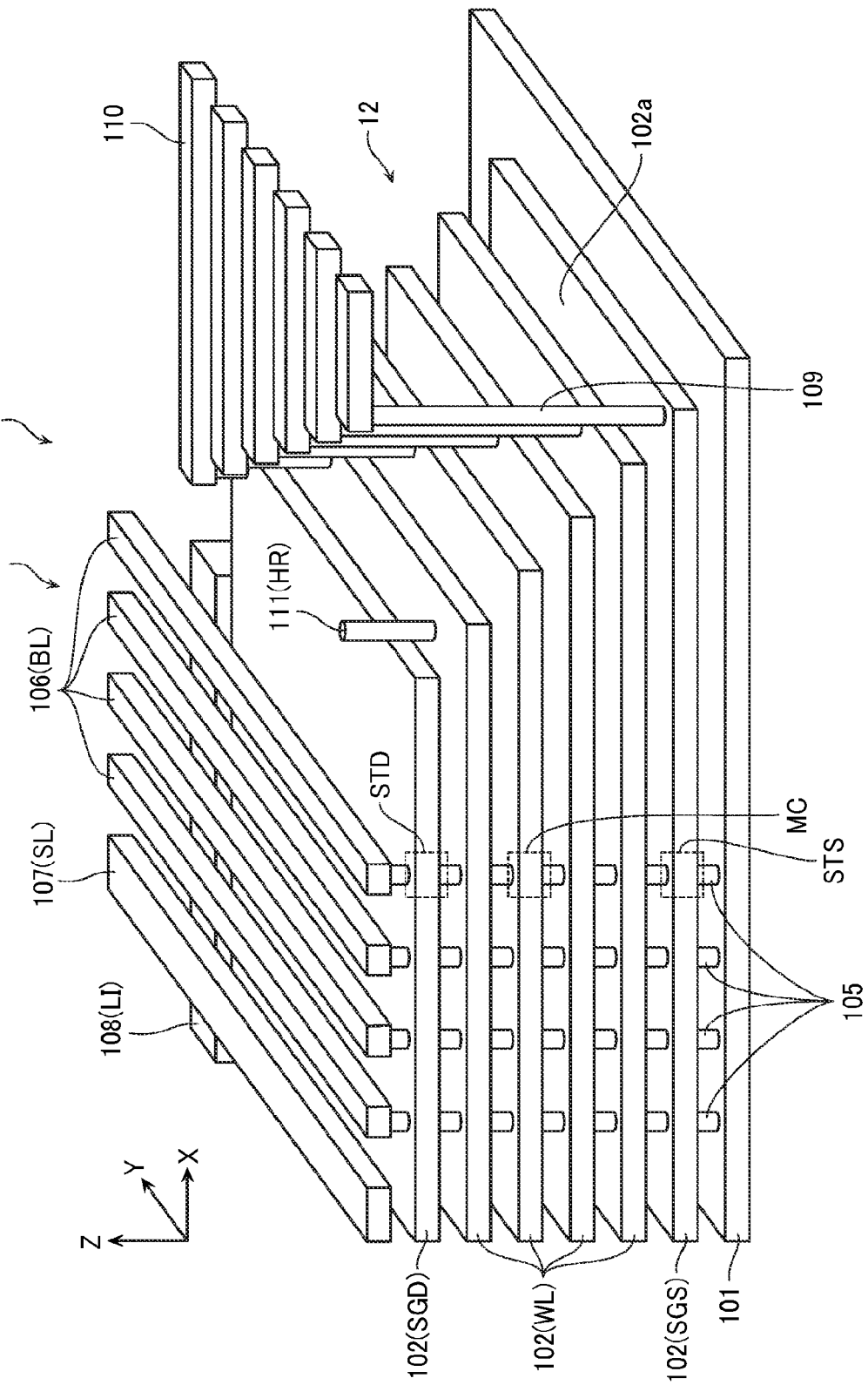
FIG. 3A is a perspective view showing the configuration of the memory cell array 1 of the same semiconductor memory device.
Figure 3B:
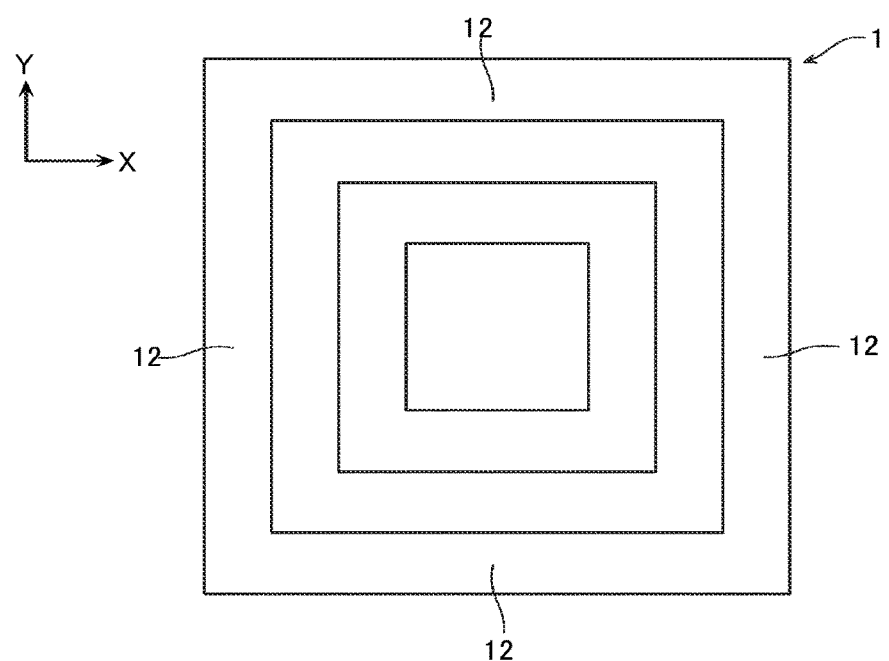
FIG. 3B is a plan view showing the configuration of the same memory cell array 1.

Next, a schematic configuration of the memory cell array 1 according to the present embodiment will be described with reference to FIGS. 3A and 3B. FIG. 3A is a schematic perspective view showing a configuration of part of a memory finger MF (memory cell group). FIG. 3B is a schematic plan view showing a configuration of a stepped portion 12 of the memory cell array 1. Note that in FIGS. 3A and 3B, part of the configuration is omitted.

As shown in FIG. 3A, the memory finger MF according to the present embodiment comprises: the substrate 101; and a plurality of conductive layers 102 stacked in a Z direction on the substrate 101. In addition, the memory finger MF includes a plurality of memory columnar bodies 105 extending in the Z direction. As shown in FIG. 3A, an intersection of the conductive layer 102 and the memory columnar body 105 functions as the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, and the drain side select gate line SGD.

As shown in FIG. 3A, the plurality of conductive layers 102 are formed in steps and configure the stepped portion 12, at their ends in an X direction.

The stepped portion 12 comprises a support 111 (HR) extending in the Z direction to penetrate the stepped portion 12.

As shown in FIG. 3A, the memory finger MF comprises a conductive layer 108 that faces side surfaces in a Y direction of the plurality of conductive layers 102, and extends in the X direction. A lower surface of the conductive layer 108 contacts the substrate 101. The conductive layer 108 is configured from a conductive layer of the likes of tungsten (W), for example, and functions as the source contact LI.

In addition, as shown in FIG. 3A, disposed above the memory finger MF are a conductive layer 106 and a conductive layer 107. The conductive layer 106 functions as the bit line BL, and the conductive layer 107 functions as the source line SL.

FIG. 3B is a schematic plan view showing the configuration of the stepped portion 12 of the memory cell array 1. In FIG. 3A, a plurality of the conductive layers 102 of the memory cell array 1 configure the stepped portion 12 at their ends in the X direction. However, as shown in FIG. 3B, the conductive layers 102 of the memory cell array 1 are formed in steps and configure the stepped portion 12 also at their ends in the Y direction. That is, the memory cell array 1 has the stepped portion 12 at its ends in each of the X and Y directions.

Figure 4:
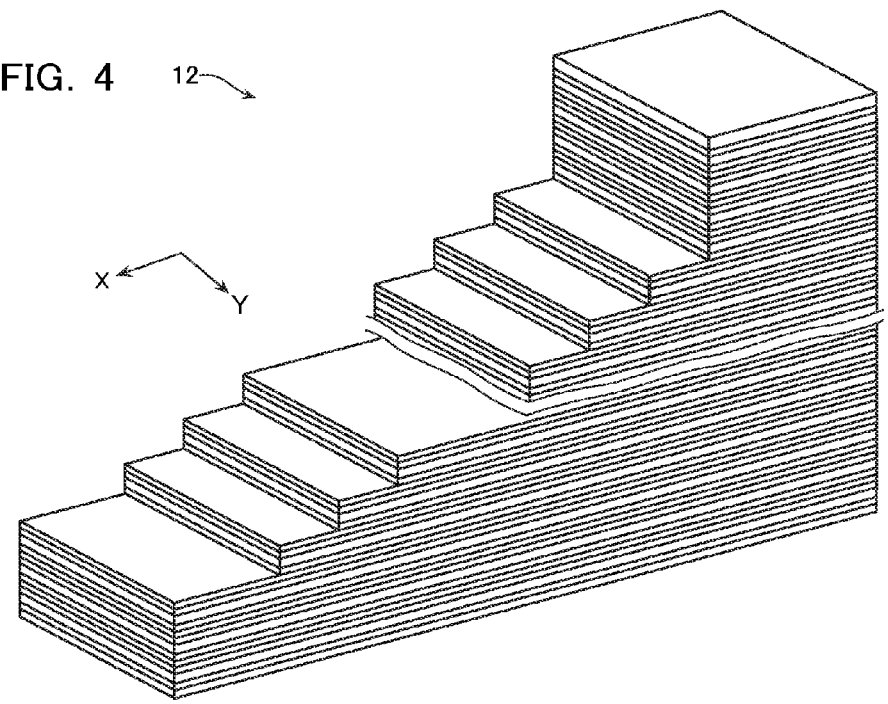
FIGS. 4 and 5 are schematic perspective views showing examples of configuration of a stepped portion 12.
Figure 5:
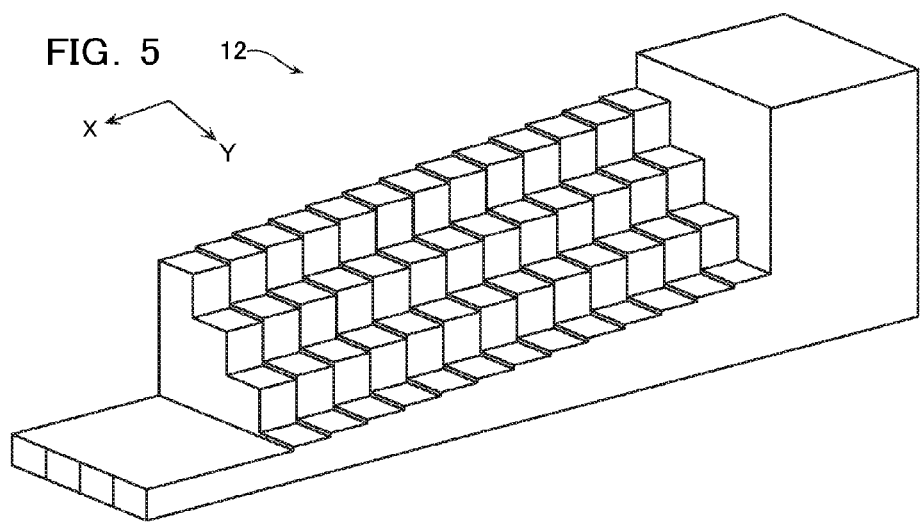

Note that the conductive layers 102 configuring the word lines WL may have a stepped structure expanding one-dimensionally only in the X direction as shown in FIG. 4, or may have a two-dimensional stepped structure expanding in both of the X direction and the Y direction as shown in FIG. 5.

Moreover, as will be mentioned later, the peripheral circuit region R2 is also provided with a stepped portion 22 having a stepped structure. This stepped portion 22 may also adopt the stepped structures of the kind shown in FIGS. 4 and 5.

Figure 6:
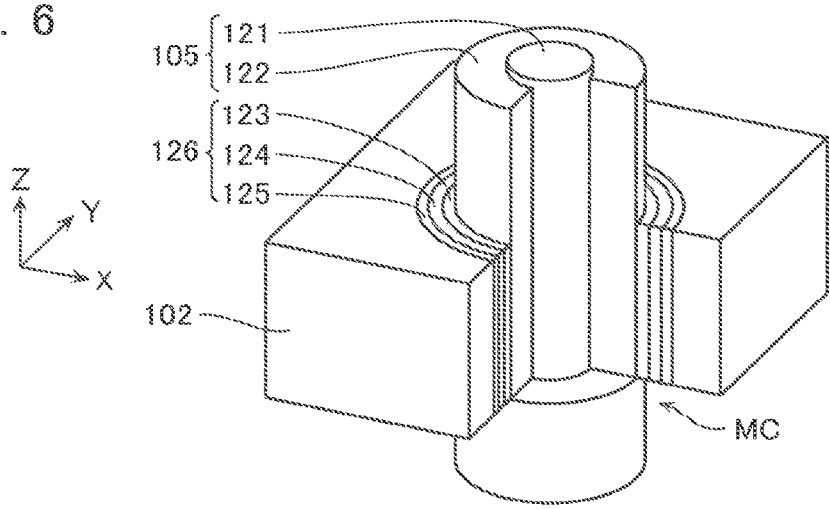
FIG. 6 is a schematic perspective cross-sectional view showing an example of configuration of one memory cell MC included in the same semiconductor memory device.

Next, a schematic configuration of the memory cell MC according to the present embodiment will be described with reference to FIG. 6. FIG. 6 is a schematic perspective view showing the configuration of the memory cell MC. Note that FIG. 6 shows the configuration of the memory cell MC, but the source side select gate transistor STS and the drain side select gate transistor STD may also be configured similarly to the memory cell MC. Moreover, in FIG. 6, part of the configuration is omitted.

As shown in FIG. 6, the memory cell MC is provided at an intersection of the conductive layer 102 and the memory columnar body 105. The memory columnar body 105 comprises: a core insulating layer 121; and a semiconductor layer 122 that covers a sidewall of the core insulating layer 121. Furthermore, a memory film 126 is provided between the semiconductor layer 122 and the conductive layer 102. The memory film 126 includes a tunnel insulating layer 123, a charge accumulation layer 124, and a block insulating layer 125.

The core insulating layer 121 is configured from an insulating layer of the likes of silicon oxide, for example. The semiconductor layer 122 is configured from a semiconductor layer of the likes of polysilicon, for example. Moreover, the semiconductor layer 122 functions as a channel of the memory cell MC, the source side select gate transistor STS, and the drain side select gate transistor STD. The tunnel insulating layer 123 is configured from an insulating layer of the likes of silicon oxide, for example. The charge accumulation layer 124 is configured from an insulating layer capable of accumulating a charge, of the likes of silicon nitride, for example. The block insulating layer 125 is configured from an insulating layer of the likes of silicon oxide, for example.

Figure 7:
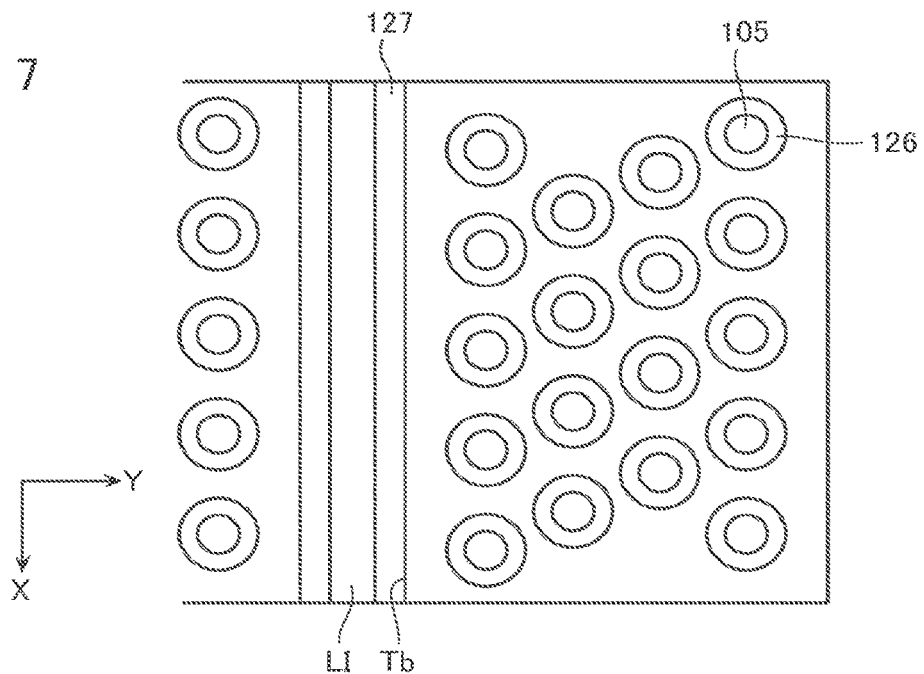
FIG. 7 is a plan view showing a configuration of part of the memory cell array 1 included in the same semiconductor memory device.

Next, a configuration of the semiconductor memory device according to the present embodiment will be described in more detail with reference to FIGS. 7 and 8. FIG. 7 is a plan view showing a configuration of part of the memory cell array 1; and FIG. 8 is a schematic cross-sectional view showing the configuration of the semiconductor memory device according to the present embodiment, and shows a cross-section taken along the line AA of FIG. 1.

As shown in FIG. 7, the memory columnar bodies 105 are arranged so as to be lined up in an oblique direction to the X direction (word line direction) and the Y direction (bit line direction), whereby an array density of the memory columnar bodies 105 is increased, and an array density of the memory cells MC is raised. However, this is merely an example, and it is also possible to configure such that the memory columnar bodies 105 are aligned along the X direction and the Y direction. In addition, the source contact LI is formed in a stripe having the X direction as its longitudinal direction, and is implanted inside a trench Tb via an inter-layer insulating film 127.

This source contact LI is implanted, via the inter-layer insulating film 127, in the trench Tb that divides the memory cell array 1 in block units. A lower end of the source contact LI contacts a diffusion layer formed in a surface of the substrate 101, and an upper end of the source contact LI is connected to the source line SL via an upper layer wiring line.

Figure 8:
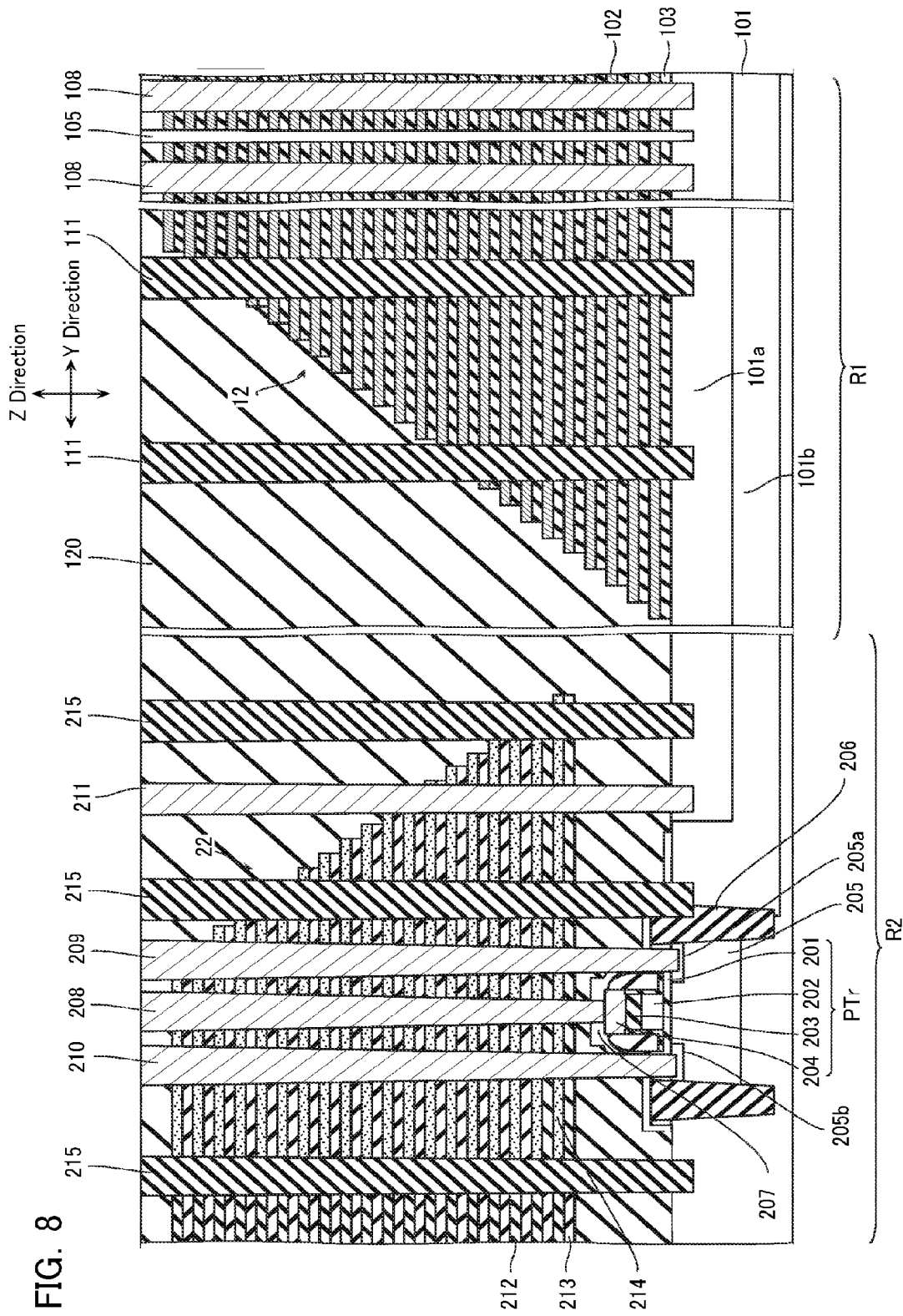
FIG. 8 is a schematic cross-sectional view showing the configuration of the same semiconductor memory device.

FIG. 8 is schematic cross-sectional view in the Z-Y directions showing a configuration of part of the above-mentioned stepped portion 12 of the memory cell array 1 and stepped portion 22 of the peripheral circuit 2. Note that in FIG. 8, part of the configuration is omitted. Moreover, the configuration shown in FIG. 8 is merely an example, and a detailed configuration, and so on, may be appropriately changed.

As shown in FIG. 8, in the stepped portion 12 of the memory cell array region R1, a plurality of the conductive layers 102 are stacked on the substrate 101 via an insulating layer 103 configured from silicon oxide, for example. These conductive layers 102 are formed in steps in the stepped portion 12. That is, ends in the X direction of the conductive layers 102 recede in a direction of increasing distance from the peripheral circuit region R2 with increasing distance in the Z direction from the substrate 101. The stepped portion 12 is provided with the support 111 for maintaining a posture of the stepped structure during a later-mentioned insulating layer replacing step.

The substrate 101 includes: a p type diffusion layer 101a implanted with a p type impurity such as boron (B); and an n type diffusion layer 101b implanted with an n type impurity such as phosphorus (P) or arsenic (As). Disposed at an end of the p type diffusion layer 101a is a contact 211 connected to the substrate 101.

Also disposed in the memory cell array 1 is the memory columnar body 105. The configuration and arrangement of the memory columnar body 105 is as described using FIGS. 6 and 7. Note that from FIG. 8 onward, the memory columnar body 105 only is illustrated, and illustration of the memory film 126 is omitted.

As shown in FIG. 8, a source contact 108 is disposed in the memory cell array region R1. The source contact 108 has a plate-like shape extending in the Z direction and the X direction as shown in FIG. 3. In addition, the source contact 108 penetrates the plurality of conductive layers 102 to have its lower end connected to the substrate 101. Illustration of the inter-layer insulating film 127 in which the source contact 108 is implanted, is also omitted.

As shown in FIG. 8, in the peripheral circuit region R2, a transistor PTr is disposed on a diffusion layer 205 of the substrate 101. The diffusion layer 205 includes a source layer 205a and a drain layer 205b.

In addition, both ends of the diffusion layer 205 are provided with an isolation insulating layer 206.

The transistor PTr includes a gate insulating layer 201, a gate polysilicon layer 202, an IPD layer 203, and a gate metal layer 204 that are stacked on the diffusion layer 205. In addition, a side surface and upper surface of these layers are covered by a barrier layer 207. Moreover, a gate contact via wiring line 208 is connected to the gate metal layer 204. Furthermore, a source contact via wiring line 209 and a drain contact via wiring line 210 are respectively connected to upper surfaces of the source layer 205a and the drain layer 205b. Note that hereafter, the gate contact via wiring line 208, the source contact via wiring line 209, the drain contact via wiring line 210, and the contact 211 will sometimes collectively be called contacts 208, 209, 210, and 211.

Note that the gate insulating layer 201 is configured from silicon oxide ($SiO_2$), for example. The gate polysilicon layer 202 is configured from polysilicon, for example. The IPD layer 203 may be configured from an insulator such as silicon oxide (SiO) or alumina (AlO), for example. The gate metal layer 204 is configured from a metal such as tungsten (W), for example. In addition, the barrier layer 207 may be configured from an insulator such as silicon nitride (SiN), or from silicon, for example. Moreover, it is also possible for part of the gate metal layer 204 to be silicided so as to be employed as the barrier metal layer 207. Note that a configuration of the transistor PTr in FIG. 8 is an example, and is not limited to that of FIG. 8. For example, the IPD layer 203 may be omitted. Moreover, the barrier layer 207 may be configured having a plurality of films stacked therein.

The stepped portion 22 is provided on the transistor PTr via an implanted insulating layer 120. This stepped portion 22 is also provided with a support 215, similarly to the stepped portion 12 of the memory cell array region R1.

The stepped portion 22 is configured by a plurality of first layers and second layers being stacked alternately in the Z direction. The first layer is configured from an insulating layer 213. The second layer is configured from an insulating layer 212 and an insulating layer 214. Moreover, ends in the X direction of the first layers 213 and the second layers (212 and 214) recede in a direction of increasing distance from the memory cell array region R1 with increasing distance from the substrate 101 in the Z direction.

In the present embodiment, the insulating layer 212 and the insulating layer 214 configuring the second layer have positions in the Z direction which are identical, and have identical film thicknesses. The insulating layer 212 and the insulating layer 214 may be disposed touching at their ends, or may have a gap existing between their ends. Moreover, close to a boundary of the ends of the insulating layers 212 and 214, there may exist a layer where materials respectively configuring the insulating layers 212 and 214 are mixed.

The insulating layer 212 is configured from silicon nitride, for example. The insulating layer 213 is configured from silicon oxide, for example. The insulating layer 214 is configured from a different material from that of the insulating layer 213. Moreover, the insulating layer 214 may be configured from a different material from that of the insulating layer 212. When the material of the insulating layer 214 is different from those of the insulating layer 212 and the insulating layer 213, it is preferable to use for the insulating layer 214 a material having a lower permittivity than those of the materials configuring the insulating layer 212 and the insulating layer 213. Specifically, an oxide to which fluorine or phosphorus has been added may be adopted as the material of the insulating layer 214, for example. Moreover, the above-described material configured from a porous medium may be employed as the material of the insulating layer 214. Moreover, it is also possible for the insulating layer 214 to be configured from an identical material to that of the insulating layer 213, for example, silicon oxide.

The insulating layer 214 is disposed at least close to each of the contacts 208, 209, 210, and 211, in the peripheral circuit region R2. In the present embodiment, as shown in FIG. 8, the insulating layer 214 is disposed straddling between the above-described contacts 208, 209, 210, and 211. In other words, the insulating layer 214 is disposed both between the contacts 208, 209, and 210 connected to the transistor PTr and between these contacts 208, 209, and 210, and the contact 211.

The insulating layer 212 is disposed more to the outside (more in the direction of increasing distance from the memory cell array region R1) than are the contacts 208, 209, and 210. Moreover, in the present embodiment, the insulating layer 214 is disposed also in a portion closer to the memory cell array region R1 than is the contact 211. However, there is no need for this portion to be the insulating layer 214, and the insulating layer 212 may be disposed in this portion.

Thus, in the present embodiment, part of the stacked structure of the stepped portion 22 is configured as the insulating layer 214 close to each of the contacts 208, 209, 210, and 211 provided in the peripheral circuit region R2. As a result, the insulating layer 213 and the insulating layer 214 can function as an inter-layer insulating layer, an increase in parasitic capacitance due to the contacts 208, 209, 210, and 211 can be suppressed, and good cell characteristics can be maintained.

Next, a method of manufacturing the semiconductor memory device according to the present embodiment will be described with reference to FIGS. 9 to 15. FIGS. 9 to 15 are schematic cross-sectional views for explaining the same method of manufacturing.

Figure 9:
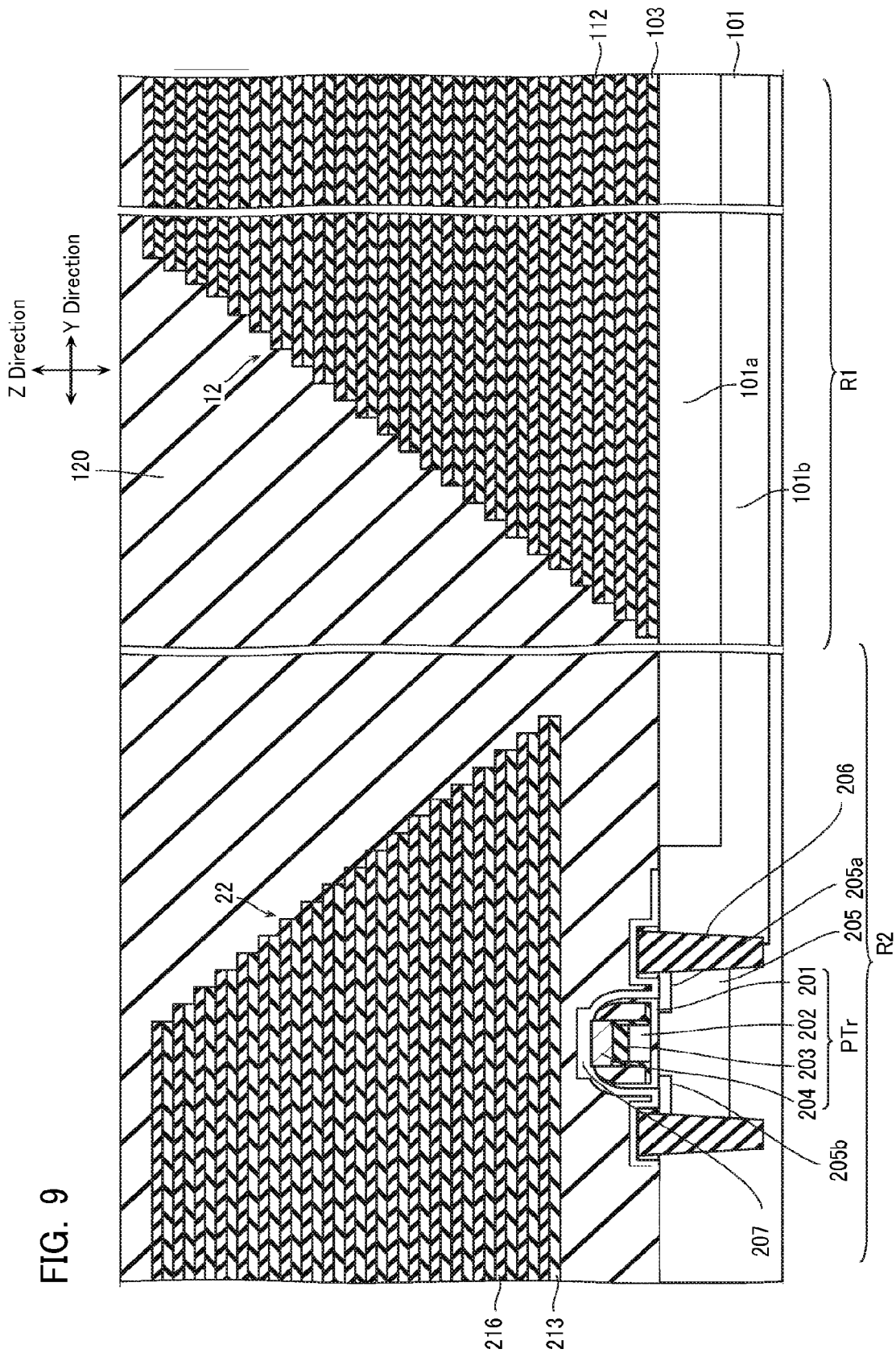
FIGS. 9 to 16 are schematic cross-sectional views showing a method of manufacturing the same semiconductor memory device.

As shown in FIG. 9, the stepped portion 12 is formed in the memory cell array region R1. In the peripheral circuit region R2, the stepped portion 22 is formed on the transistor PTr. The stepped portion 12 is formed by the insulating layer 103 of the likes of silicon oxide and a sacrifice layer 112 of the likes of silicon nitride being stacked on the substrate 101 and being step-processed. The stepped portion 22 is formed by the insulating layer 213 of the likes of silicon oxide and a sacrifice layer 216 of the likes of silicon nitride being stacked on the substrate 101 where the peripheral circuit including the transistor PTr is formed, and being step-processed. After formation of the stepped portion 12 and the stepped portion 22, the insulating layer 120 is implanted. The insulating layer 120 may be configured from silicon oxide, for example.

Figure 10:
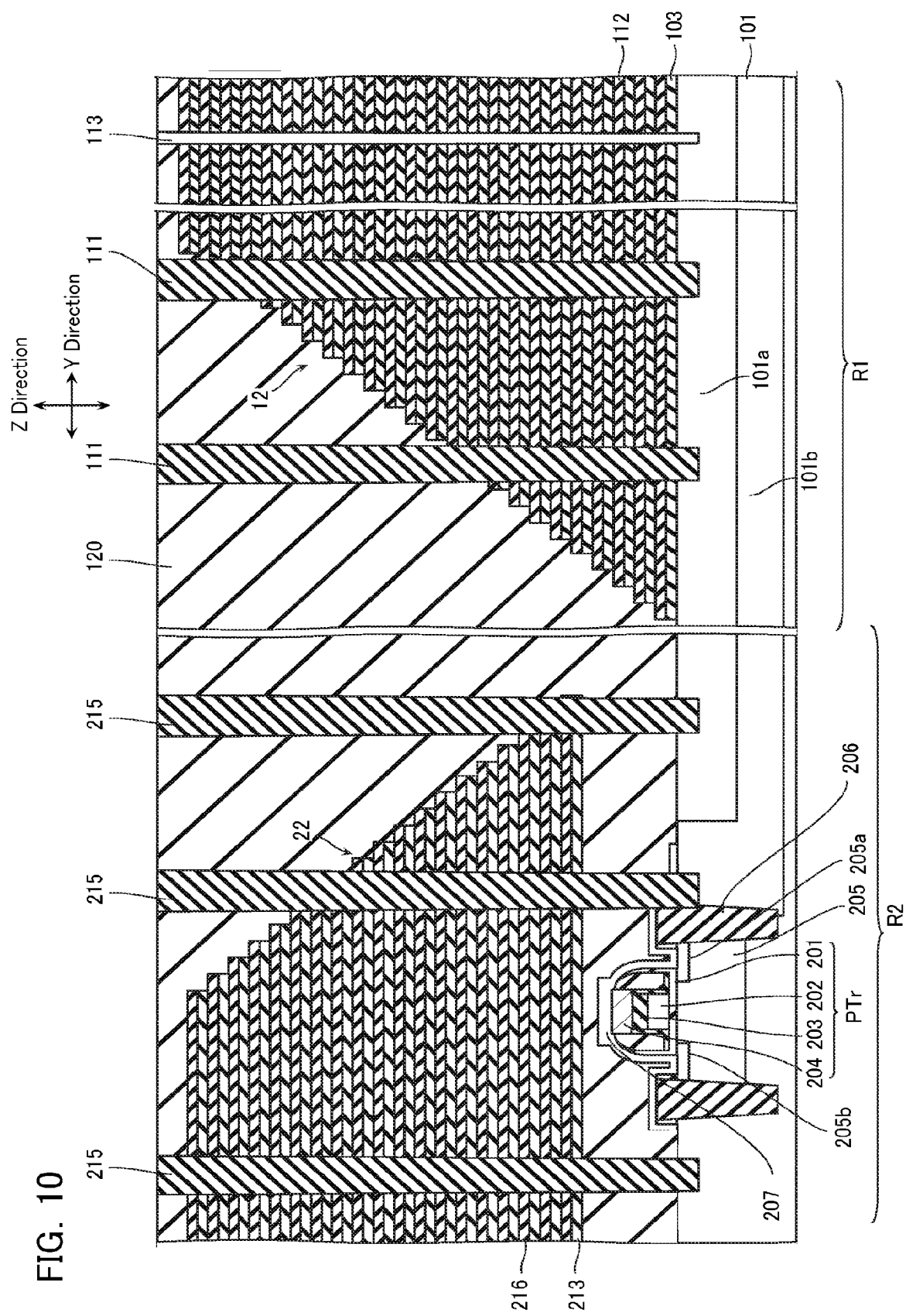

As shown in FIG. 10, the support 111 in the memory cell array region R1 and the support 215 in the peripheral circuit region R2 are formed by etching, and so on. In addition, a memory hole 113 for forming the memory columnar body 105 is formed by etching, and so on. In the present embodiment, the supports 111 and 215 are formed such that their lower ends reach the surface of the substrate 101. Moreover, the support 111 and the support 215 may adopt a configuration similar to that of the memory columnar body 105. Moreover, the support 111 and the support 215 may be configured from an insulating material such as silicon oxide.

Figure 11:
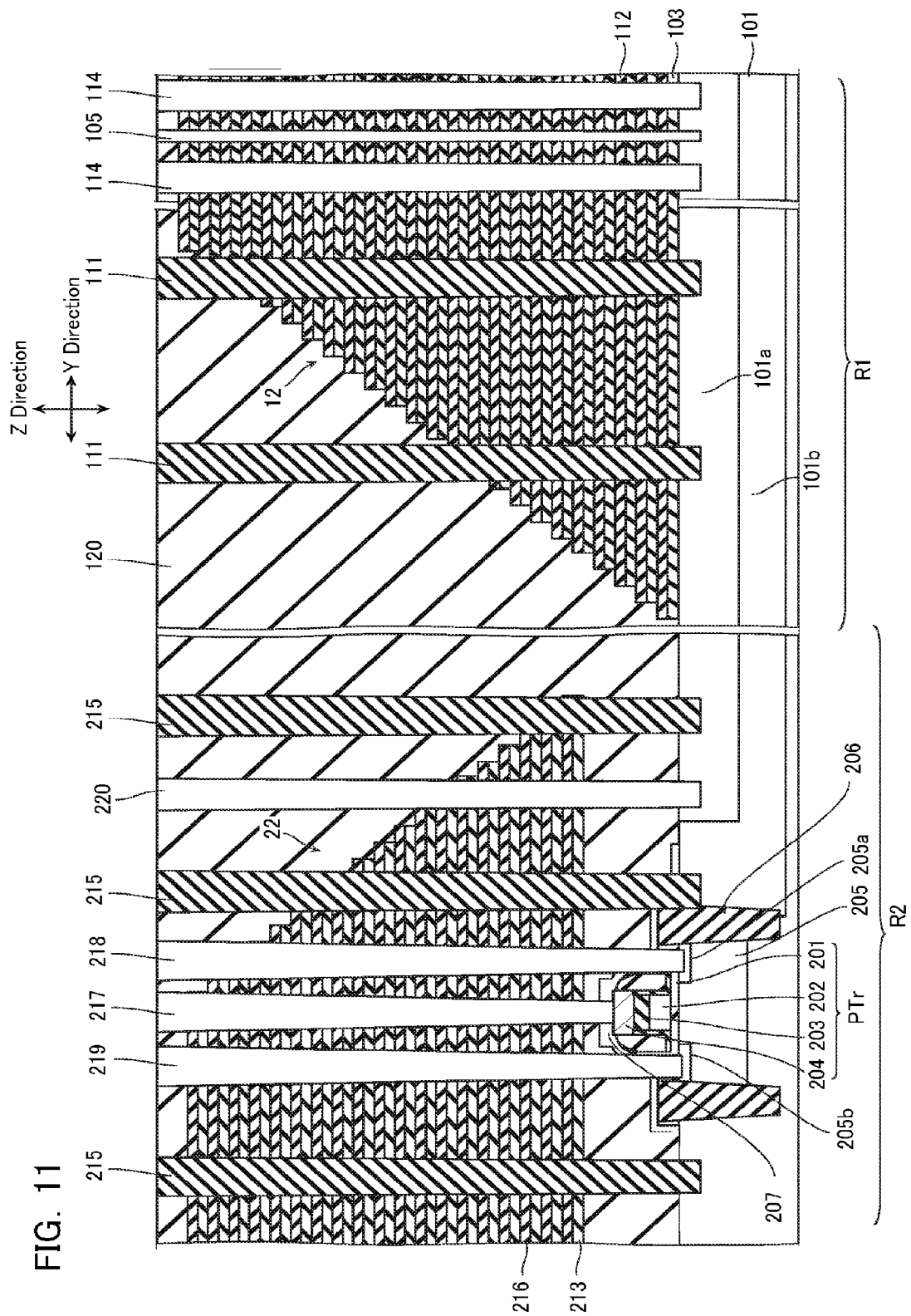

As shown in FIG. 11, unillustrated charge accumulation layer, semiconductor layer, and so on, are deposited in the memory hole 113, and an unillustrated memory film and the memory columnar body 105 are formed. A slit 114 for forming the source contact 108 in the memory cell array region R1 is formed. In addition, a gate contact hole 217 for forming the gate contact via wiring line 208, a source contact hole 218 for forming the source contact via wiring line 209, a drain contact hole 219 for forming the drain contact via wiring line 210, and a contact hole 220 for forming the contact 211 in the peripheral circuit region R2, are formed. Note that hereafter, these gate contact hole 217, source contact hole 218, drain contact hole 219, and contact hole 220 will sometimes collectively be called contact holes 217, 218, 219, and 220.

In the present embodiment, these formation of the slit 114 and formation of the contact holes 217, 218, 219, and 220 are performed simultaneously.

Figure 12:
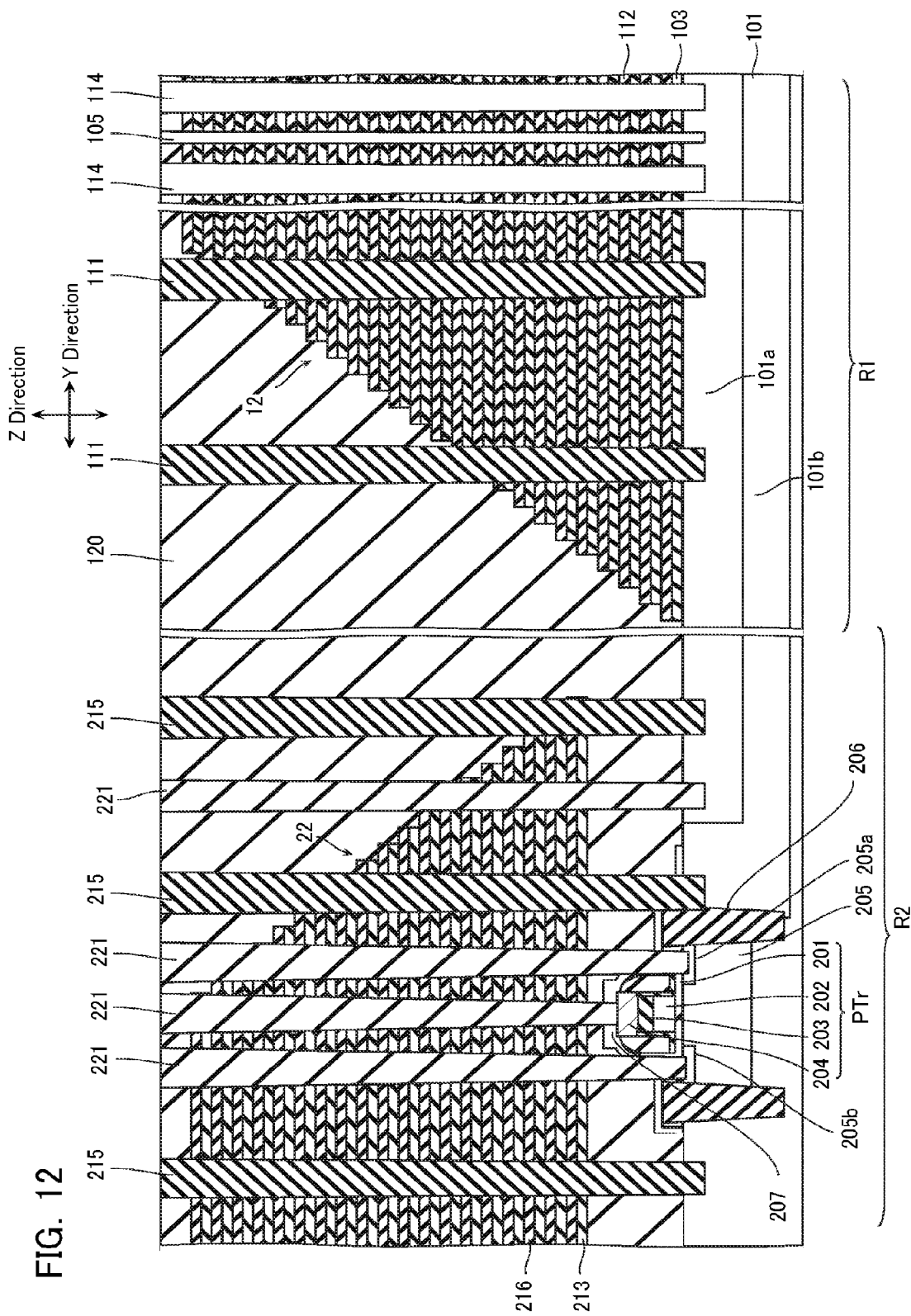

As shown in FIG. 12, the contact holes 217, 218, 219, and 220 in the peripheral circuit region R2 are implanted by an implanting material 221 of the likes of carbon, for example. Employable as this implanting material 221 is a material that can be easily detached by the likes of an asher, as will be mentioned later. Moreover, it is also possible to configure such that only upper portions of the contact holes 217, 218, 219, and 220 are implanted, by a film having low implanting properties (coverage).

Figure 13:
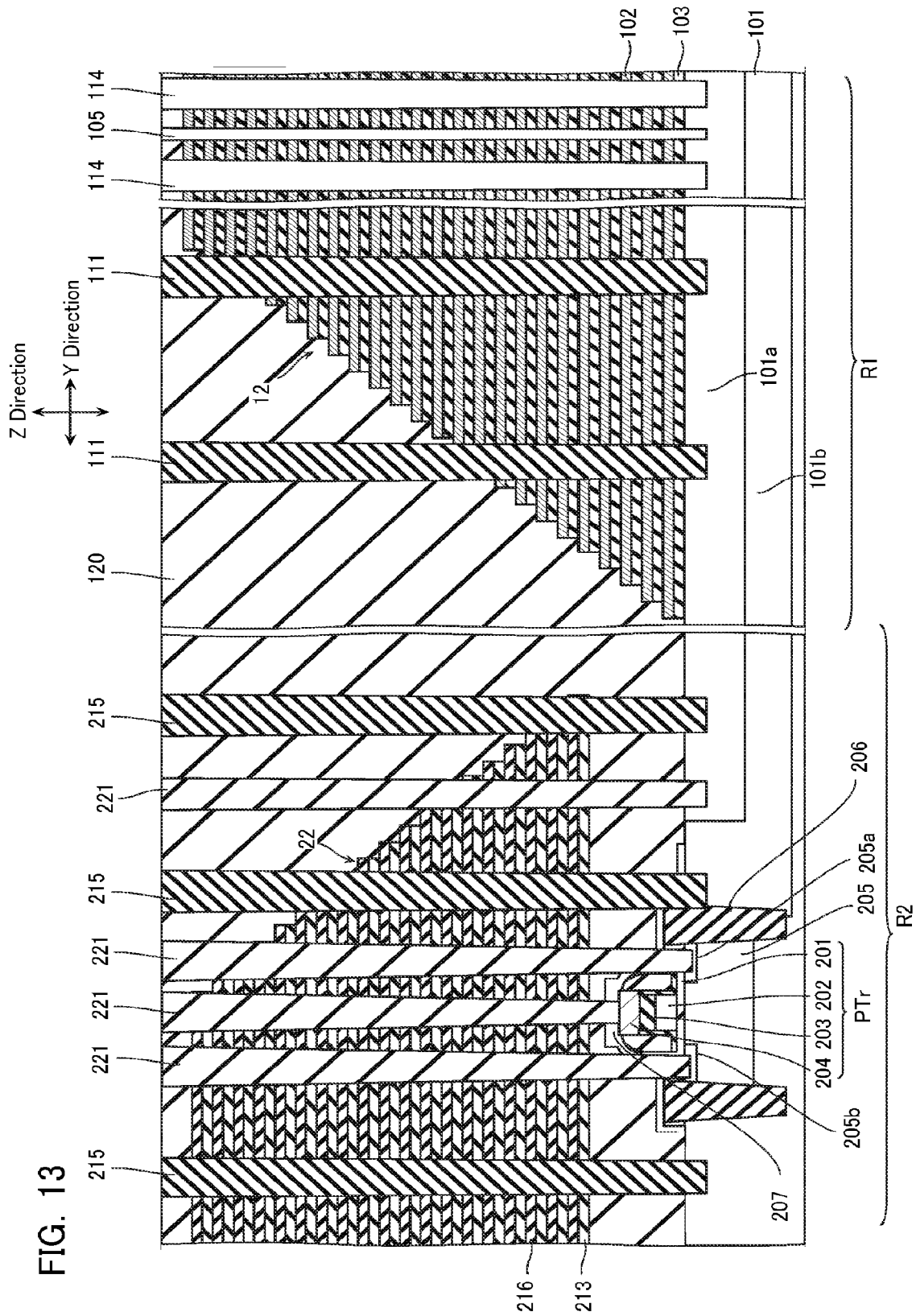

As shown in FIG. 13, in the memory cell array region R1, the sacrifice film 112 is removed via the slit 114, and the conductive layer 102 is deposited. The sacrifice film 112 configured from the likes of silicon nitride is removed by wet etching by a phosphoric acid system solution, for example. The conductive layer 102 configured from the likes of tungsten is deposited by a CVD method, for example.

Figure 14:
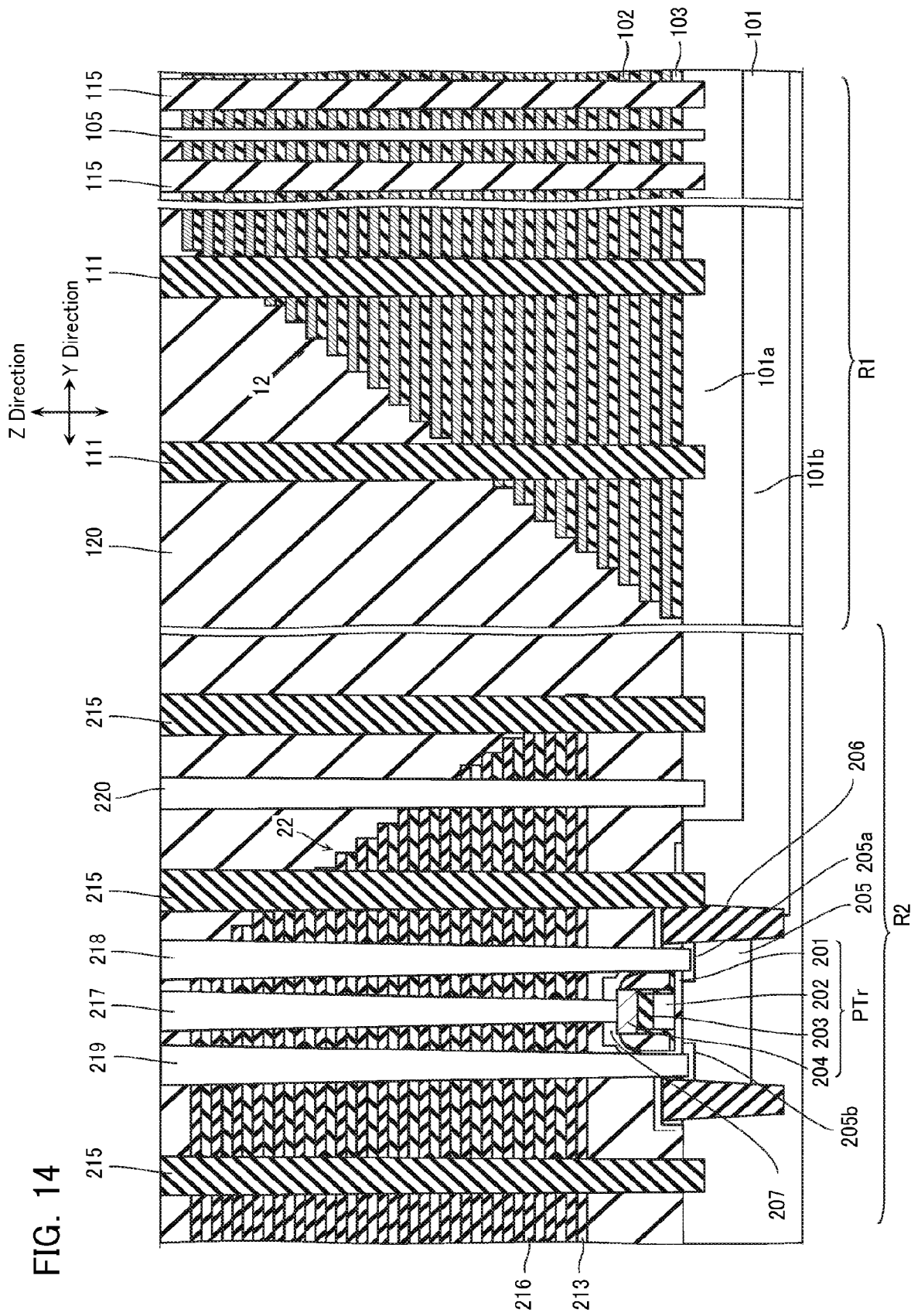

As shown in FIG. 14, in the peripheral circuit region R2, the implanting material 221 that was implanted in the contact holes 217, 218, 219, and 220 is removed by the likes of an asher, for example. Moreover, in the memory cell array region R1, the slit 114 is implanted by an implanting material 115. A material of the implanting material 115 is similar to that of the implanting material 221.

Figure 15:
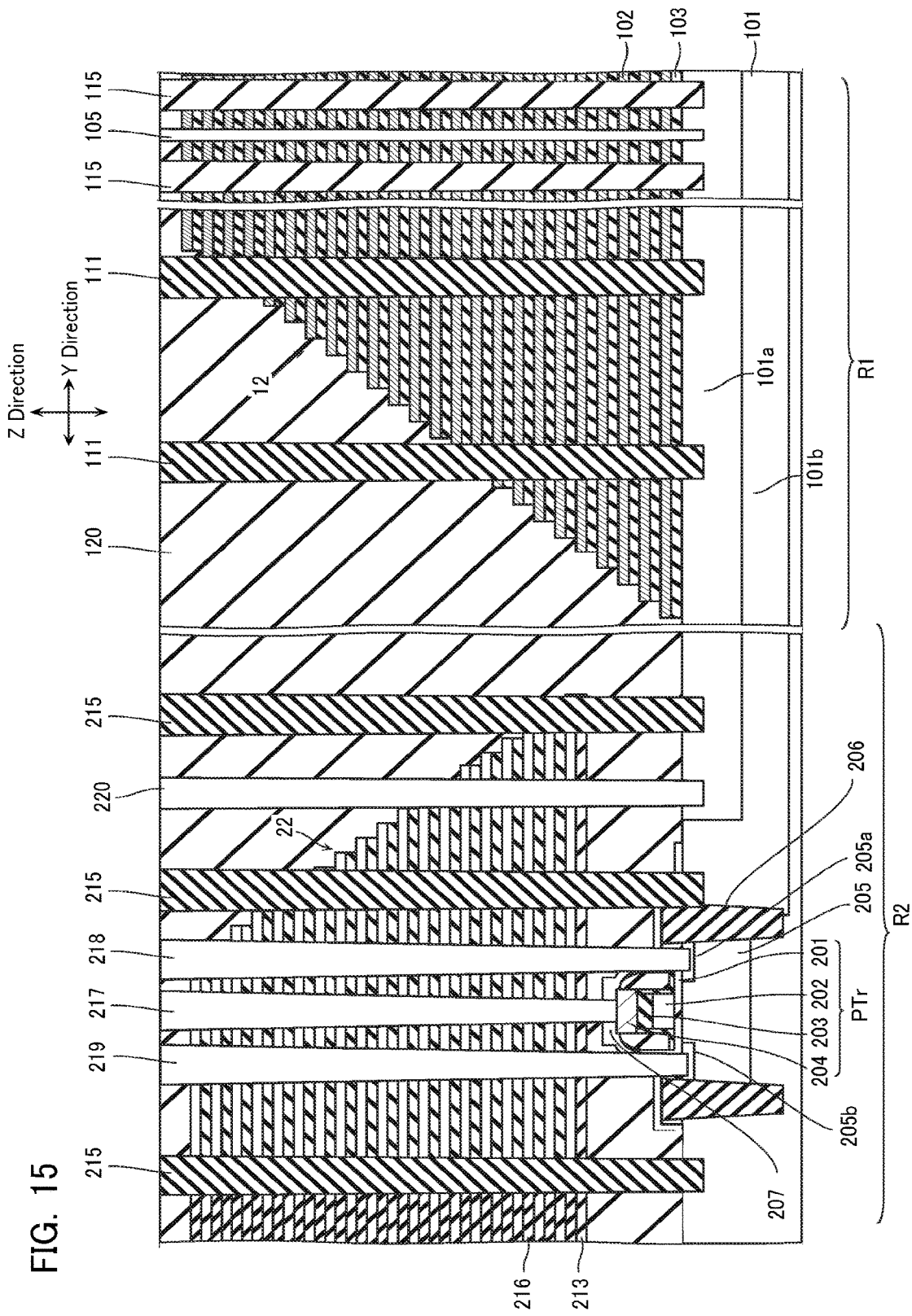

As shown in FIG. 15, in the peripheral circuit region R2, the sacrifice layer 216 close to the contact holes 217, 218, 219, and 220 is removed by the likes of wet etching. When the sacrifice layer 216 is configured from silicon nitride, the wet etching can be performed using a phosphoric acid system solution. As shown in FIG. 15, as a result of removing the sacrifice layer 216, the sacrifice layer 216 between the contact holes 217, 218, 219, and 220 is removed. The sacrifice layer 216 in a region other than between the contact holes 217, 218, 219, and 220 (in the present embodiment, a region distant from the contact hole 219 which is farthest from the memory cell array region R1) is not removed and becomes the insulating layer 212. As this makes clear, the insulating layer 212 is configured from an identical material to that of the sacrifice layer 216.

Figure 16:
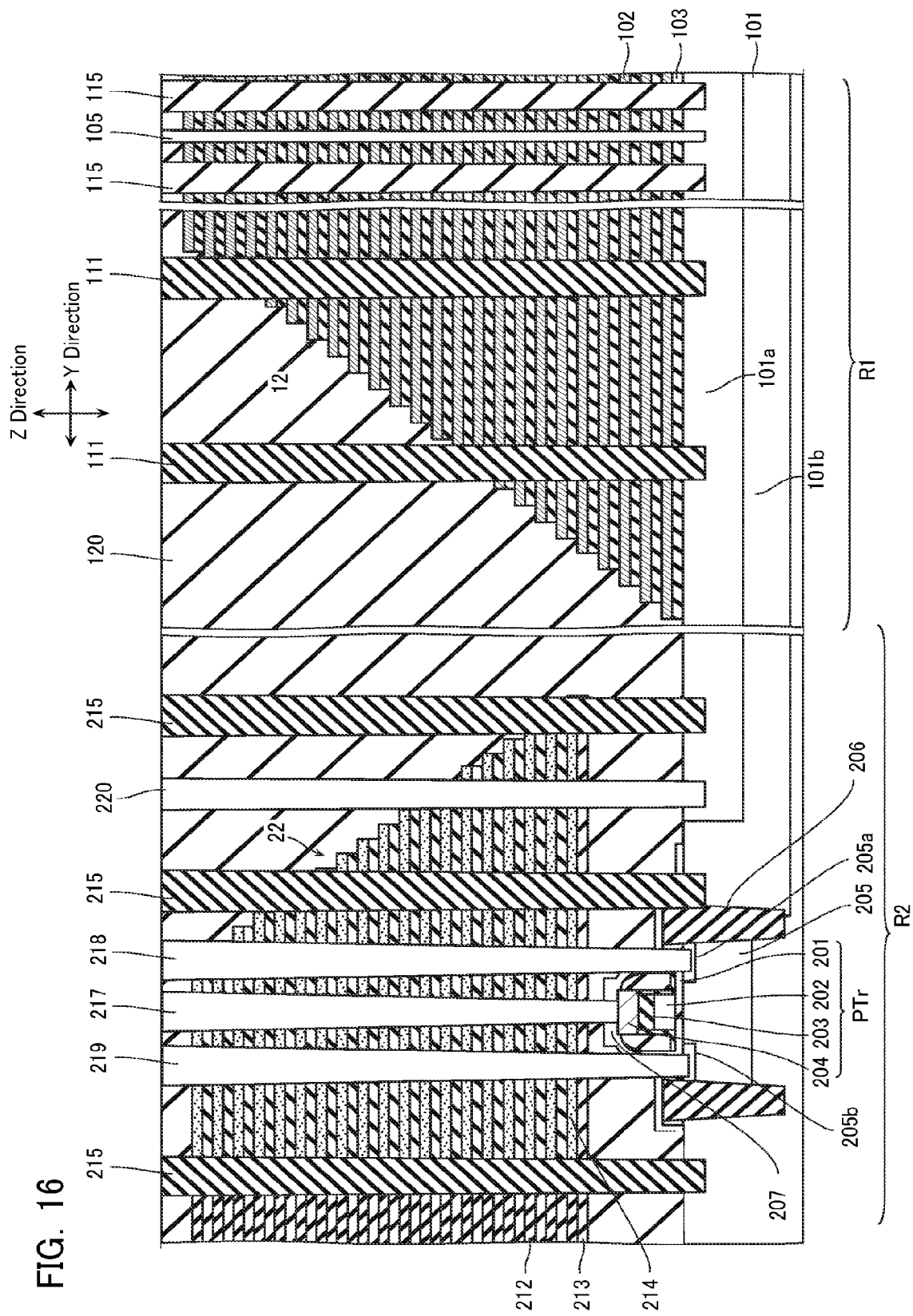

As shown in FIG. 16, the insulating layer 214 is deposited in a gap generated by the sacrifice layer 216 being removed, by performing the likes of a CVD method via the contact holes 217, 218, 219, and 220. As a result, in the peripheral circuit region R2, a layer between the plurality of insulating layers 213 stacked in the Z direction is configured by the insulating layer 212 and the insulating layer 214. The material configuring the insulating layer 214 is as mentioned above.

Now, as described above, the insulating layer 214 is replaced via the contact holes 217, 218, 219, and 220 provided in the peripheral circuit region R2. A diameter of the contact hole is small compared to an area of the sacrifice layer 216 requiring replacement, hence a gas required for deposition of the insulating layer 214 sometimes does not sufficiently permeate into the gap generated by removal of the sacrifice layer 216. Therefore, the insulating layer 214 sometimes has a density which is lower compared to those of the insulating layer 212 and insulating layer 213. Moreover, many cavities are sometimes formed in the insulating layer 214. That is, the insulating layer 214 is sometimes formed in a porous medium.

Finally, the implanting material 115 is removed, and the slit 114 and contact holes 217, 218, 219, and 220 are implanted with a metal such as tungsten via the barrier metal layer, and so on. As a result, the source contact 108, the gate contact via wiring line 208, the source contact via wiring line 209, the drain contact via wiring line 210, and the contact 211 are formed, and the configuration of FIG. 8 is obtained.

In the present embodiment, as mentioned above, in the peripheral circuit region R2, part of the sacrifice layer 216 is replaced by a layer configured from the likes of a low permittivity material, without the stepped portion 22 being removed. This makes it possible for the stepped portion 22 to be employed as an inter-layer insulating layer as mentioned above. Moreover, a process of removing the configuration of the stepped portion 22 to implant with an inter-layer insulating layer and then planarize becomes unnecessary, and a degree of difficulty of a manufacturing process can be significantly reduced.

Second Embodiment

Next, a method of manufacturing a semiconductor memory device according to a second embodiment will be described using FIGS. 17 and 18.

A configuration of the semiconductor memory device according to the second embodiment is identical to that of the semiconductor memory device according to the first embodiment shown in FIG. 8, and a description thereof will be omitted.

The method of manufacturing of the second embodiment is partially different from that of the first embodiment. Specifically, the method of manufacturing the semiconductor memory device according to the second embodiment is identical to that of the first embodiment up to the step described using FIG. 10 in the first embodiment, but a subsequent manufacturing step is different.

In the first embodiment, as described using FIG. 11, the slit 114 in the memory cell array region R1 and the contact holes 217, 218, 219, and 220 in the peripheral circuit region R2 were formed simultaneously.

Figure 17:
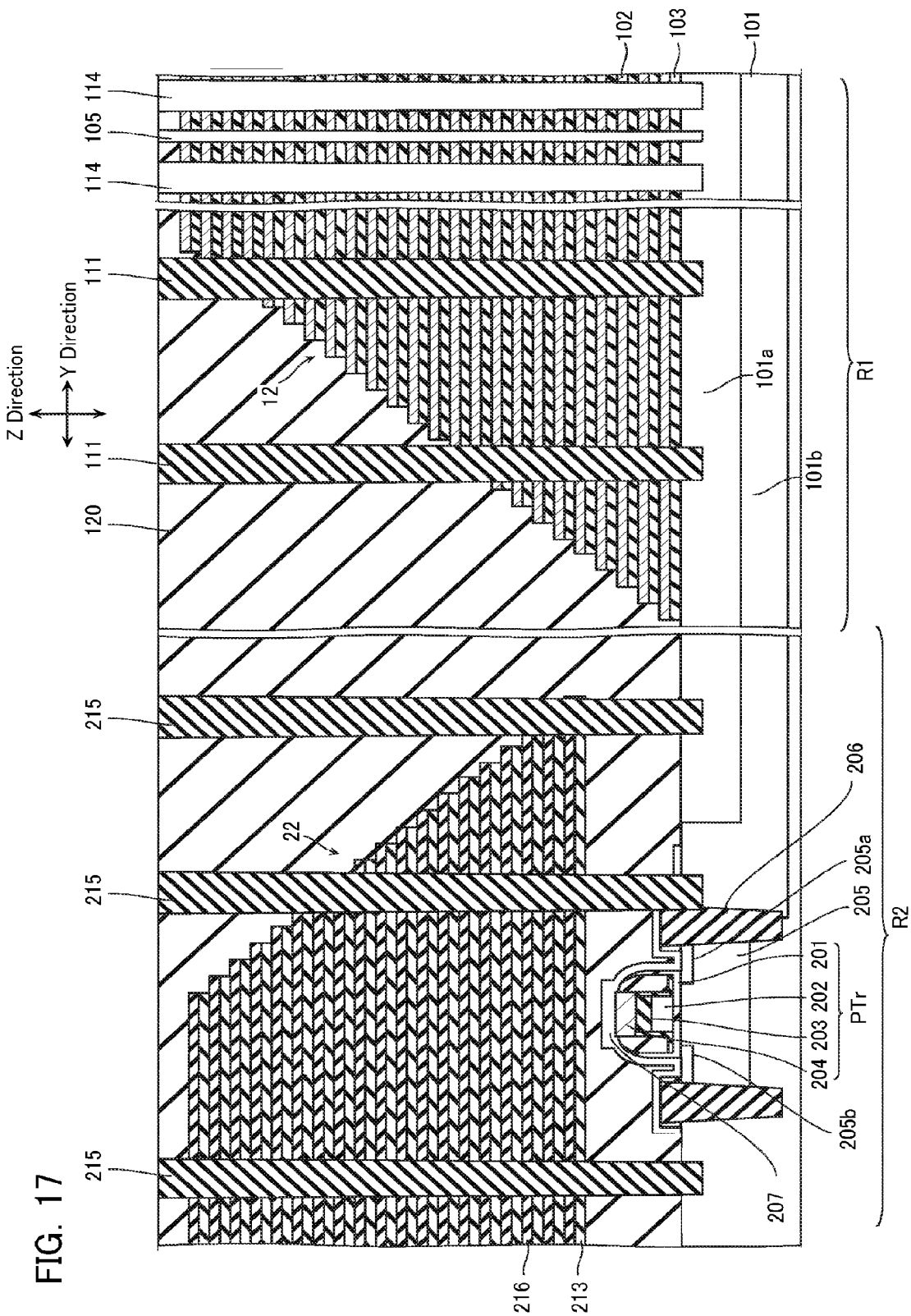
FIGS. 17 and 18 are schematic cross-sectional views showing a method of manufacturing a semiconductor memory device according to a second embodiment.

However, in the second embodiment, as shown in FIG. 17, after the step described using FIG. 10 in the first embodiment, first, only the slit 114 in the memory cell array region R1 is formed. In addition, the sacrifice layer 112 is replaced by the conductive layer 102.

Figure 18:
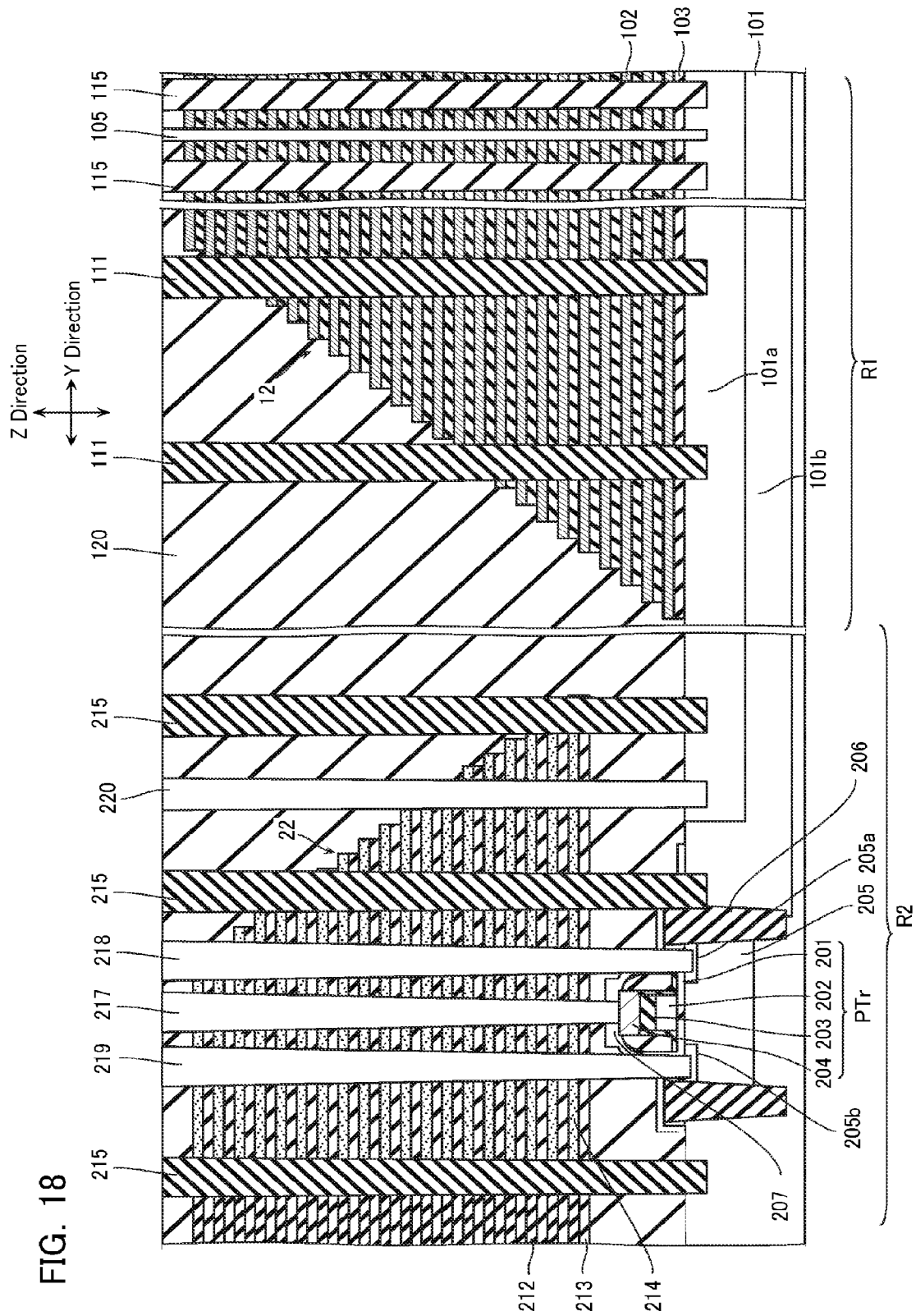

As shown in FIG. 18, the slit 114 is implanted by the implanting material 115, and the contact holes 217, 218, 219, and 220 are formed. Then, the sacrifice layer 216 close to the contact holes 217, 218, 219, and 220 is replaced by the insulating layer 214. As a result, the insulating layer 212 and the insulating layer 214 are obtained.

Subsequently, the implanting material 115 is removed, the slit 114 and contact holes 217, 218, 219, and 220 are implanted with a metal such as tungsten, and the configuration of FIG. 8 is obtained.

Similar advantages to those of the first embodiment are obtained also by this second embodiment.

Third Embodiment

A method of manufacturing a semiconductor memory device according to a third embodiment will be described using FIGS. 19 and 20.

A configuration of the semiconductor memory device according to the third embodiment is identical to those of the first embodiment and second embodiment, and a description thereof will be omitted.

The third embodiment, similarly to the second embodiment, is identical to the first embodiment up to the step described using FIG. 10, but a subsequent manufacturing step is partially different.

Figure 19:
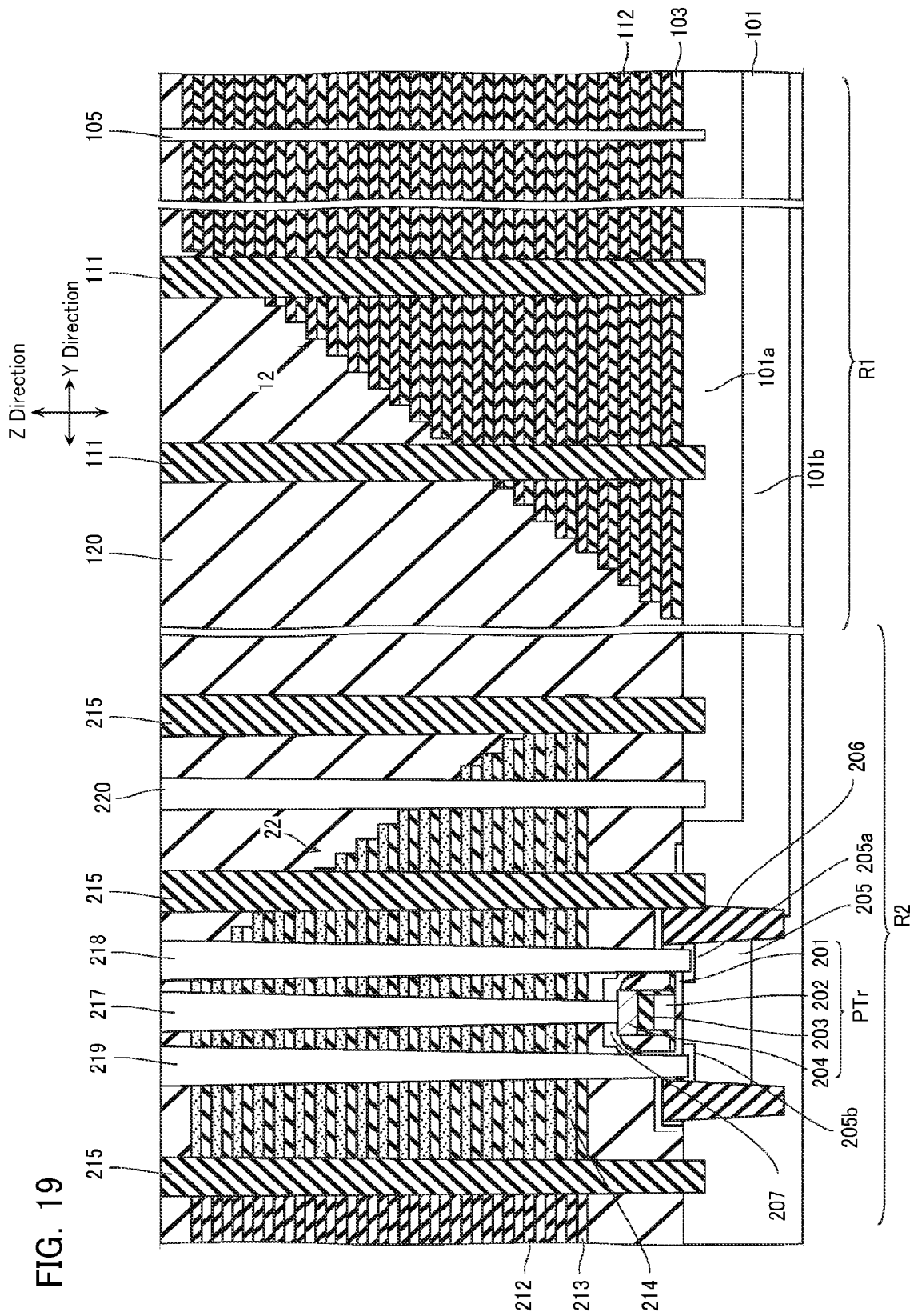
FIGS. 19 and 20 are schematic cross-sectional views showing a method of manufacturing a semiconductor memory device according to a third embodiment.

In the third embodiment, as shown in FIG. 19, after the step described using FIG. 10 in the first embodiment, first, the contact holes 217, 218, 219, and 220 are formed. In addition, the sacrifice layer 216 close to each of the contact holes 217, 218, 219, and 220 is removed and replaced by the insulating layer 214. As a result, the insulating layer 212 is formed.

Figure 20:
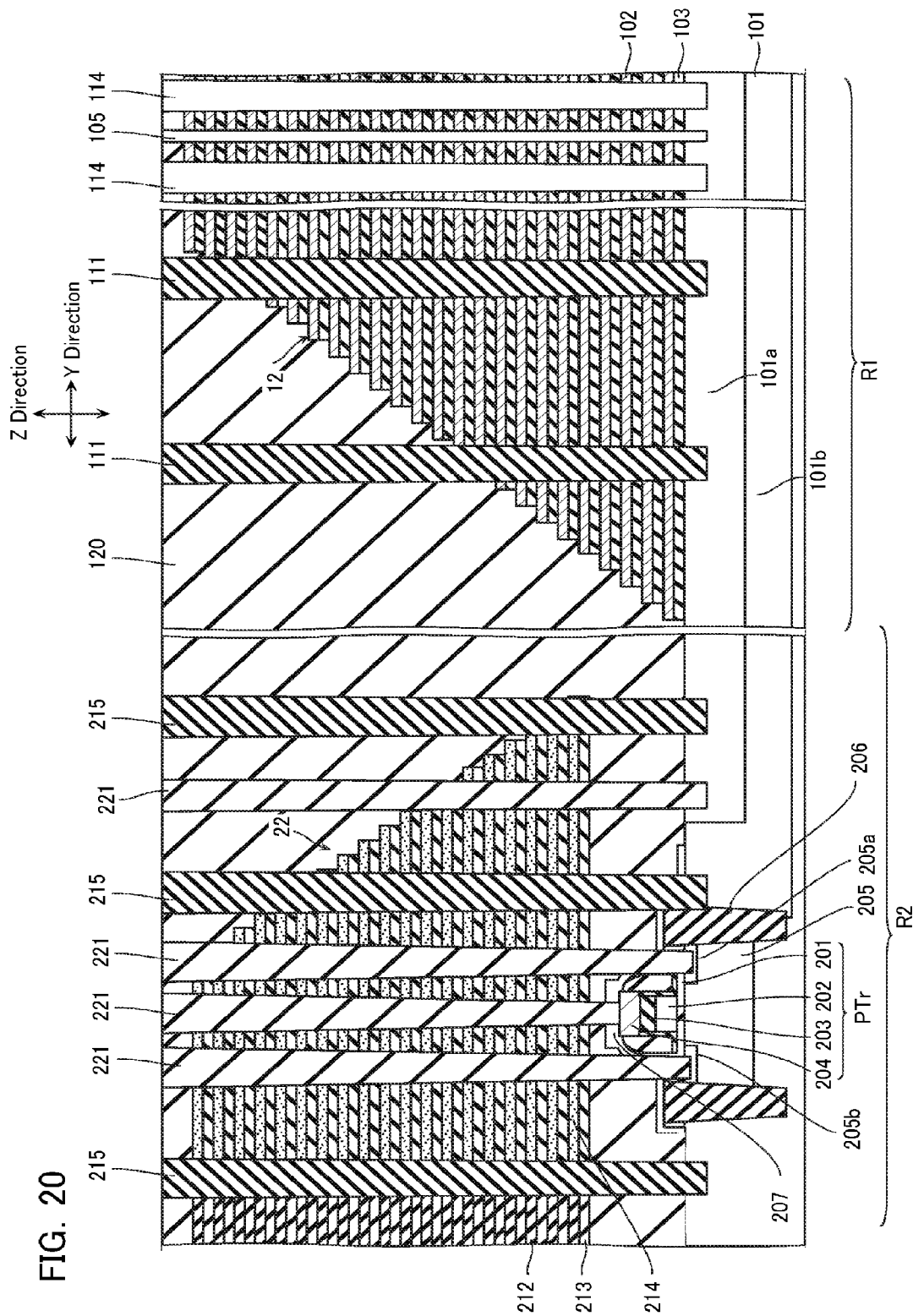

As shown in FIG. 20, the contact holes 217, 218, 219, and 220 are implanted by the implanting material 221, and the slit 114 is formed in the memory cell array region R1. The sacrifice layer 112 in the memory cell array region R1 is removed, and the conductive layer 102 is deposited.

Then, the implanting material 221 is removed, the slit 114 and contact holes 217, 218, 219, and 220 are implanted by a metal layer, and the configuration of FIG. 8 is obtained.

Similar advantages to those of the first embodiment and second embodiment are obtained also by this third embodiment.

Fourth Embodiment

A semiconductor memory device according to a fourth embodiment will be described using FIG. 21.

Figure 21:
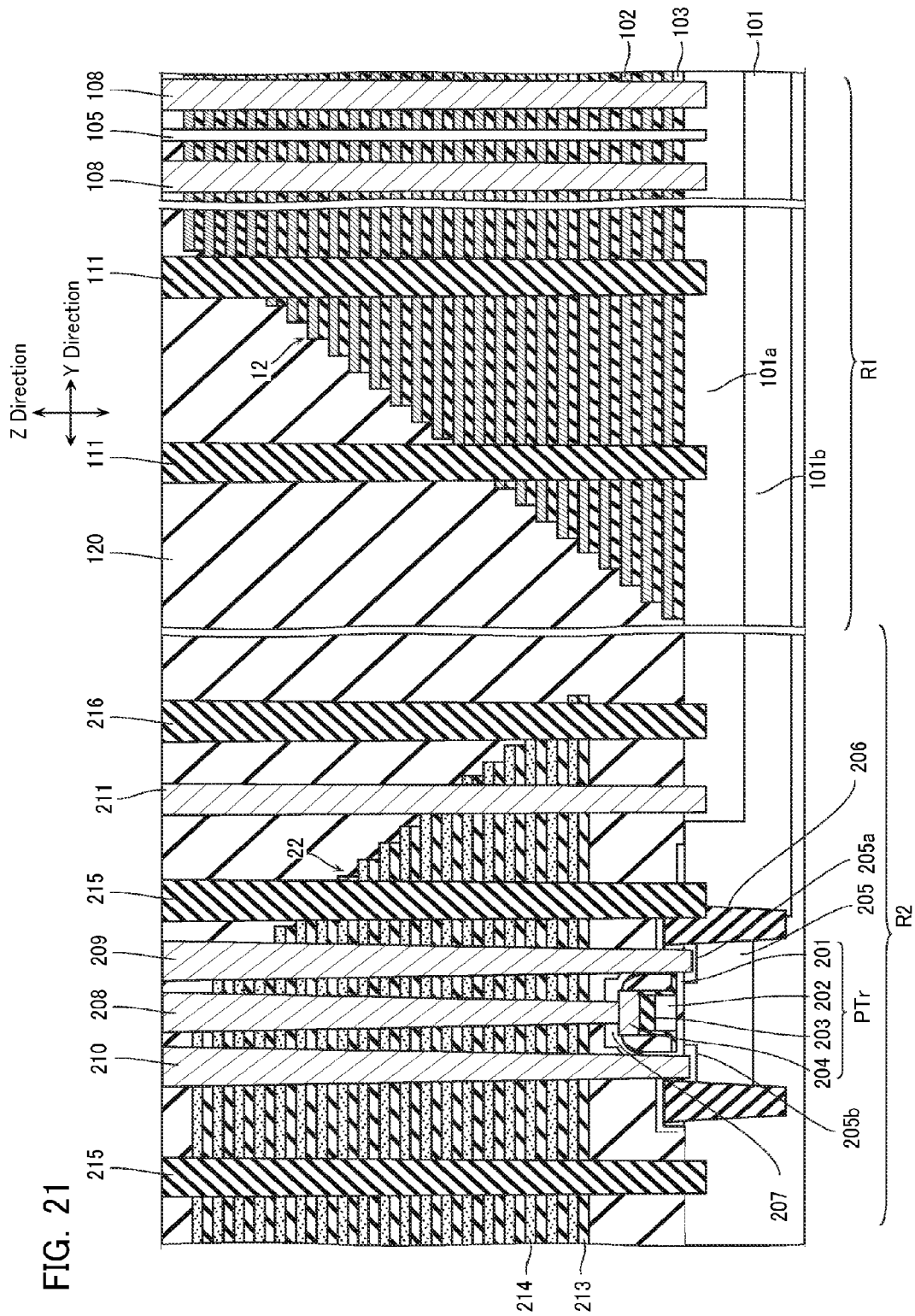
FIG. 21 is a schematic cross-sectional view showing a configuration of a semiconductor memory device according to a fourth embodiment.

As shown in FIG. 21, the semiconductor memory device according to the fourth embodiment has a configuration in which the entire sacrifice layer 216, not only close to the contacts 208, 209, 210, and 211, is replaced by the insulating layer 214. The material configuring the insulating layer 214 is a material that at least differs from the material configuring the sacrifice layer 216. Moreover, the material configuring the insulating layer 214 may be the same material as the insulating layer 213 or may be a different material from the insulating layer 213. When a material different from that of the insulating layer 213 is employed, a material having a lower permittivity than that of the material of the insulating layer 213 may be employed.

In order to manufacture the semiconductor memory device according to the present embodiment, it is only required that, for example, in the step for replacing part of the sacrifice layer 216 by the insulating layer 214 described using FIGS. 14 to 16 in the first embodiment, all of the sacrifice layer 216 is removed and replaced by the insulating layer 214. Moreover, it is possible to employ a separately formed hole, not only the contact holes 217, 218, 219, and 220, in removal of the sacrifice layer 216 and deposition of the insulating layer 214.

Similar advantages to those of the above-described embodiments are obtained also by such a configuration.

Now, when the sacrifice layer 216 (insulating layer 212) is configured from silicon nitride, for example, silane (SiH$_4$) is sometimes employed during deposition of the silicon nitride. Sometimes, at that time, hydrogen radicals due to the silane penetrate the tunnel insulating layer in the transistor PTr, and electron concentration in the tunnel insulating layer increases. There is a risk that thereupon, electron traps in the tunnel insulating layer resultantly increase, electrons flowing through the transistor PTr are captured in the electron traps, and cell characteristics deteriorate.

Due to the present embodiment, there may also be expected an advantage that the above-described increase in electron traps is more suppressed due to the sacrifice layer 216 being completely removed.

Fifth Embodiment

Figure 22:
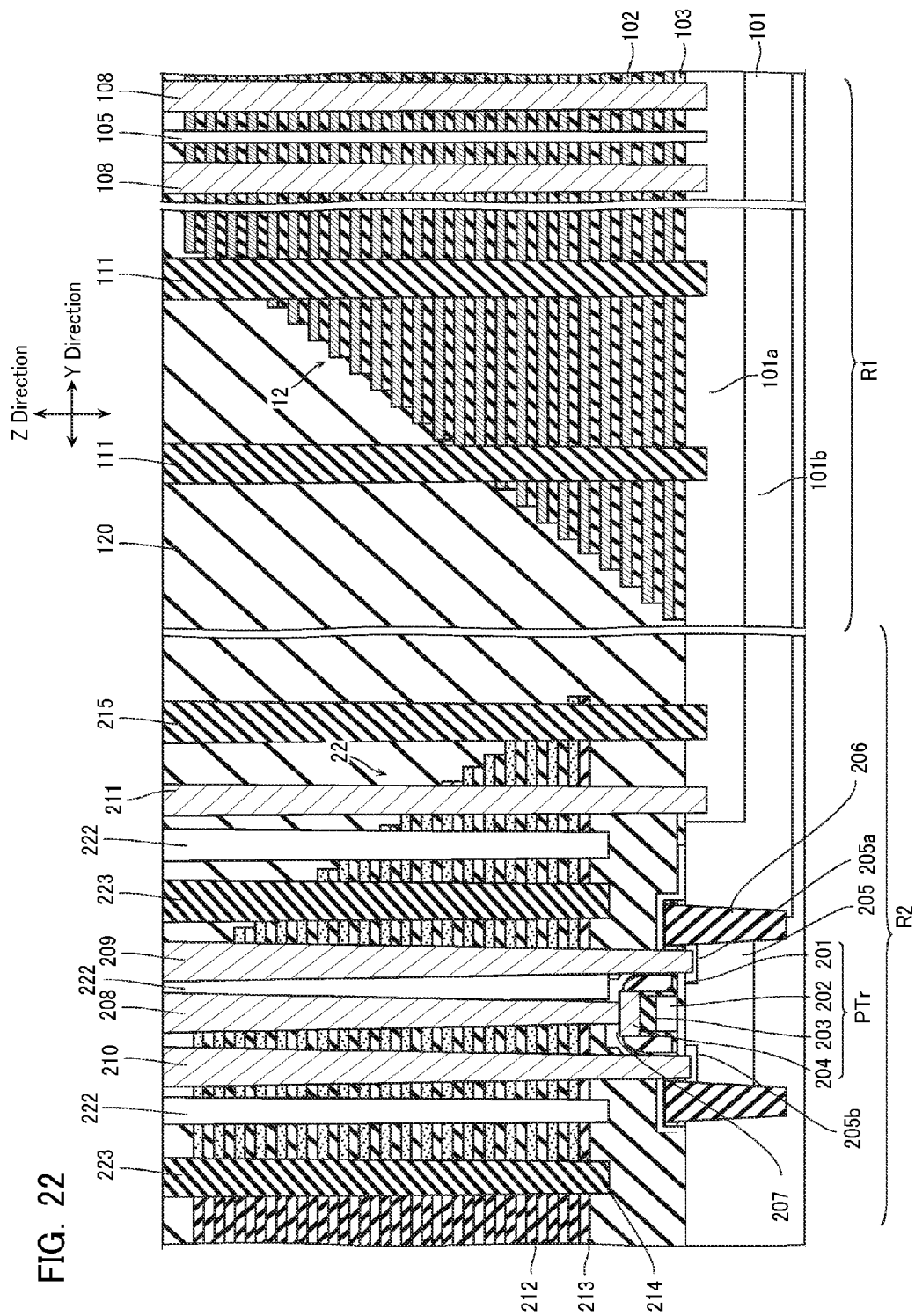
FIG. 22 is a schematic cross-sectional view showing a configuration of a semiconductor memory device according to a fifth embodiment.

A semiconductor memory device according to a fifth embodiment will be described using FIGS. 22 to 26. FIG. 22 is a schematic cross-sectional view showing a configuration of the semiconductor memory device according to the fifth embodiment; and FIGS. 23 to 26 are schematic cross-sectional views showing a method of manufacturing the same semiconductor memory device.

As shown in FIG. 22, the semiconductor memory device according to the fifth embodiment has a configuration in the memory cell array region R1 which is similar to those of the first embodiment through fourth embodiment.

The semiconductor memory device according to the fifth embodiment has a plurality of holes 222 provided in the peripheral circuit region R2. These holes 222 are employed when removing the sacrifice layer 216 close to the contact holes 217, 218, 219, and 220 to be replaced by the insulating layer 214. Therefore, the plurality of holes 222 may be formed close to a position where the contacts 208, 209, 210, and 211 are formed. Lower ends of the plurality of holes 222 are positioned between a lowermost surface of the stepped portion 22 and the surface of the substrate 101.

Some of supports 223 in the peripheral circuit region R2 have their lower ends positioned between the lowermost surface of the stepped portion 22 and the surface of the substrate 101.

This configuration makes it possible to form the replacement-dedicated hole 222 at any position to perform replacement of the sacrifice layer 216 by the insulating layer 214, without employing a contact hole that requires being positioned at a certain position.

In addition, the lower end of the support 223 being positioned between the substrate 101 and the lowermost surface of the stepped portion 22 makes it possible for the likes of the implanted insulating layer 120 between the substrate 101 and the stepped portion 22 to be prevented from being damaged during removal of the sacrifice layer 216 and replacement by the insulating layer 214.

A method of manufacturing the semiconductor memory device according to the fifth embodiment will be described using FIGS. 23 to 26.

Figure 23:
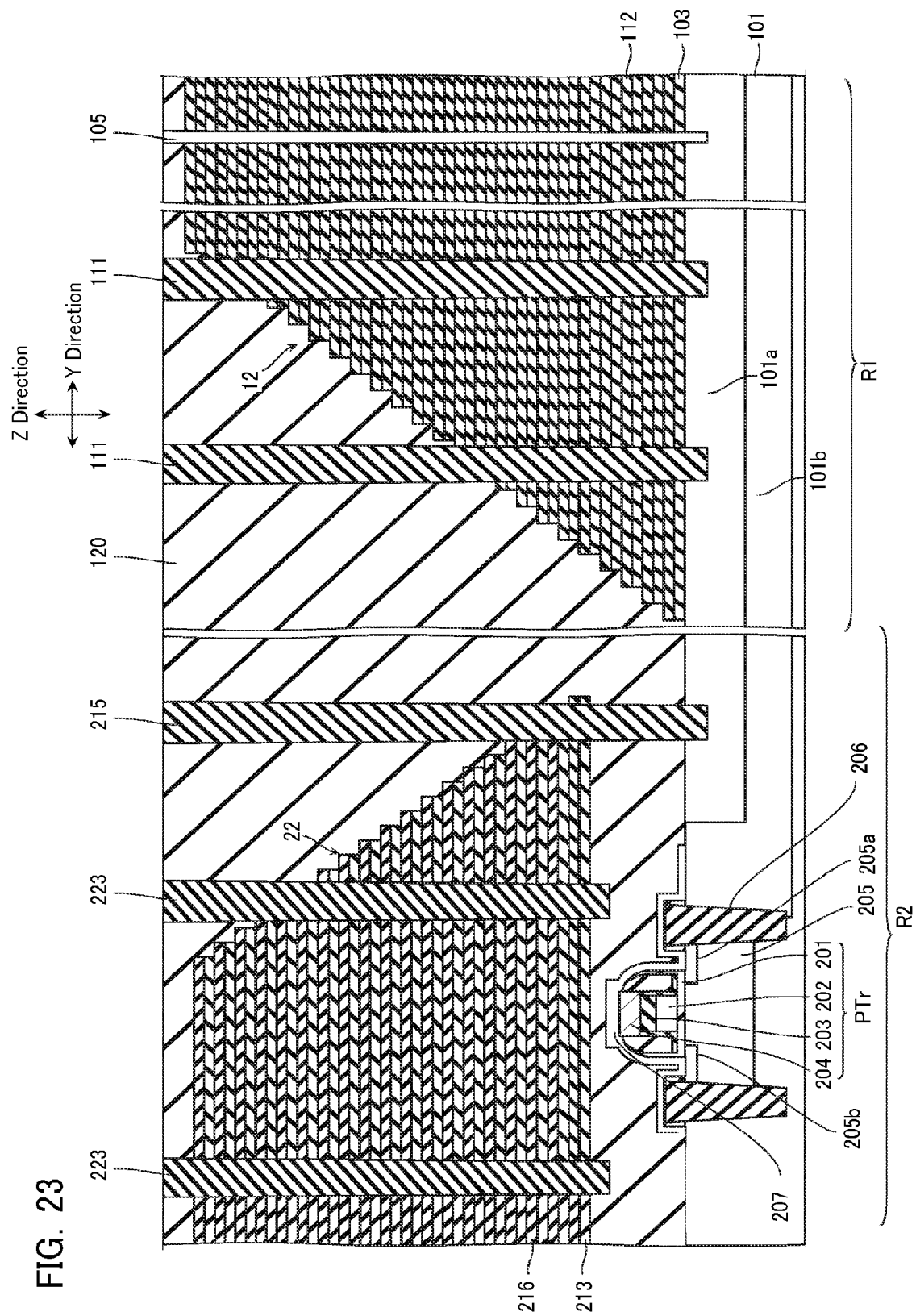
FIGS. 23 to 26 are schematic cross-sectional views showing a method of manufacturing the same semiconductor memory device.

As shown in FIG. 23, after the step described using FIG. 9 of the first embodiment, the memory columnar body 105 and the support 111 are formed in the memory cell array region R1. In the peripheral circuit region R2, the supports 215 and 223 are formed.

Now, the supports 111 and 215 are formed by ordinary etching, whereby their lower ends reach the surface of the substrate 101.

On the other hand, the support 223 in the present embodiment is formed by half-etching. As a result, its lower end is disposed between the lowermost surface of the stepped portion 22 and the surface of the substrate 101, without reaching the surface of the substrate 101.

Figure 24:
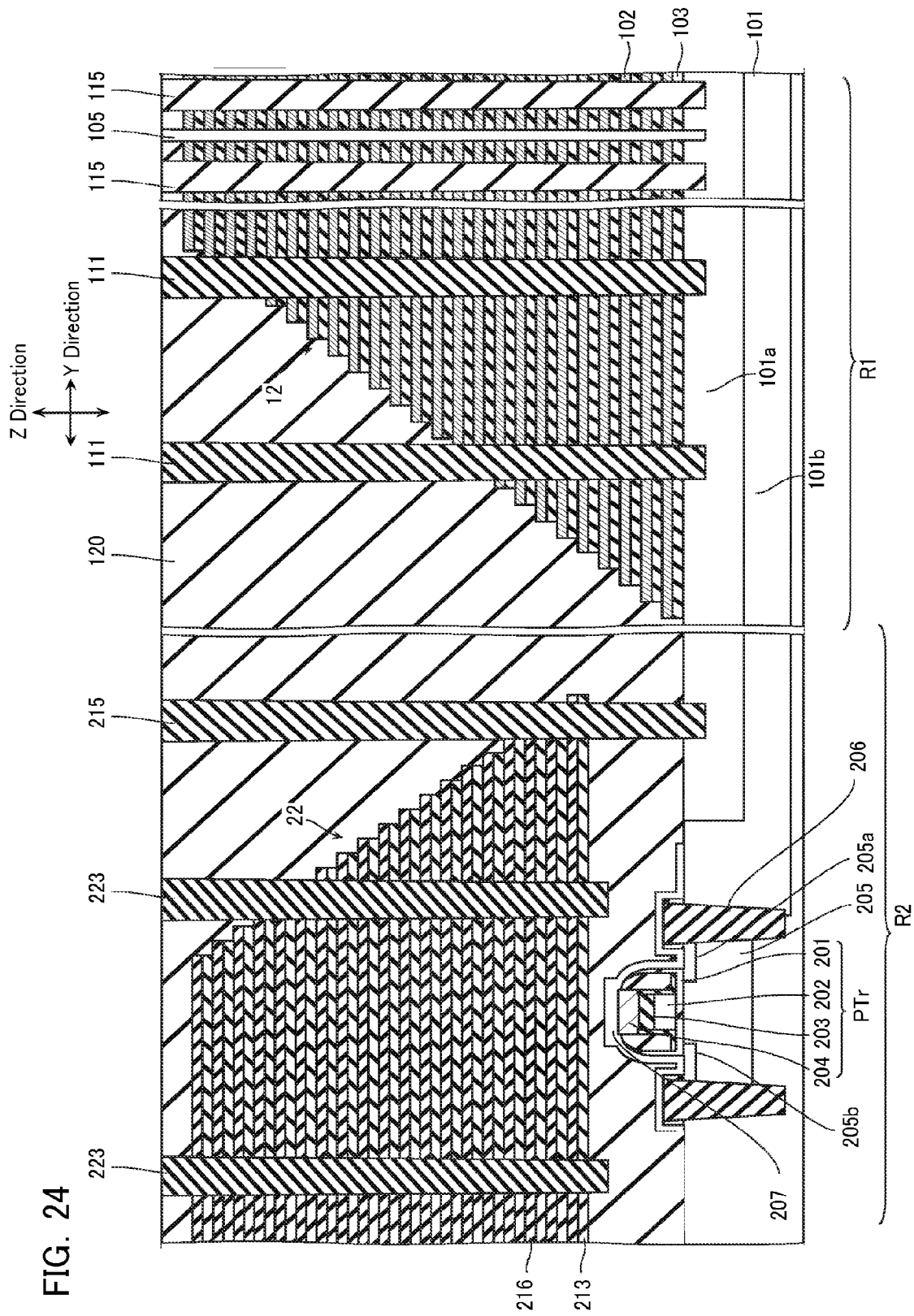

As shown in FIG. 24, in the memory cell array region R1, the slit 114 is formed, the sacrifice layer 112 is replaced by the conductive layer 102, and the slit 114 is implanted by the implanting material 115.

Figure 25:
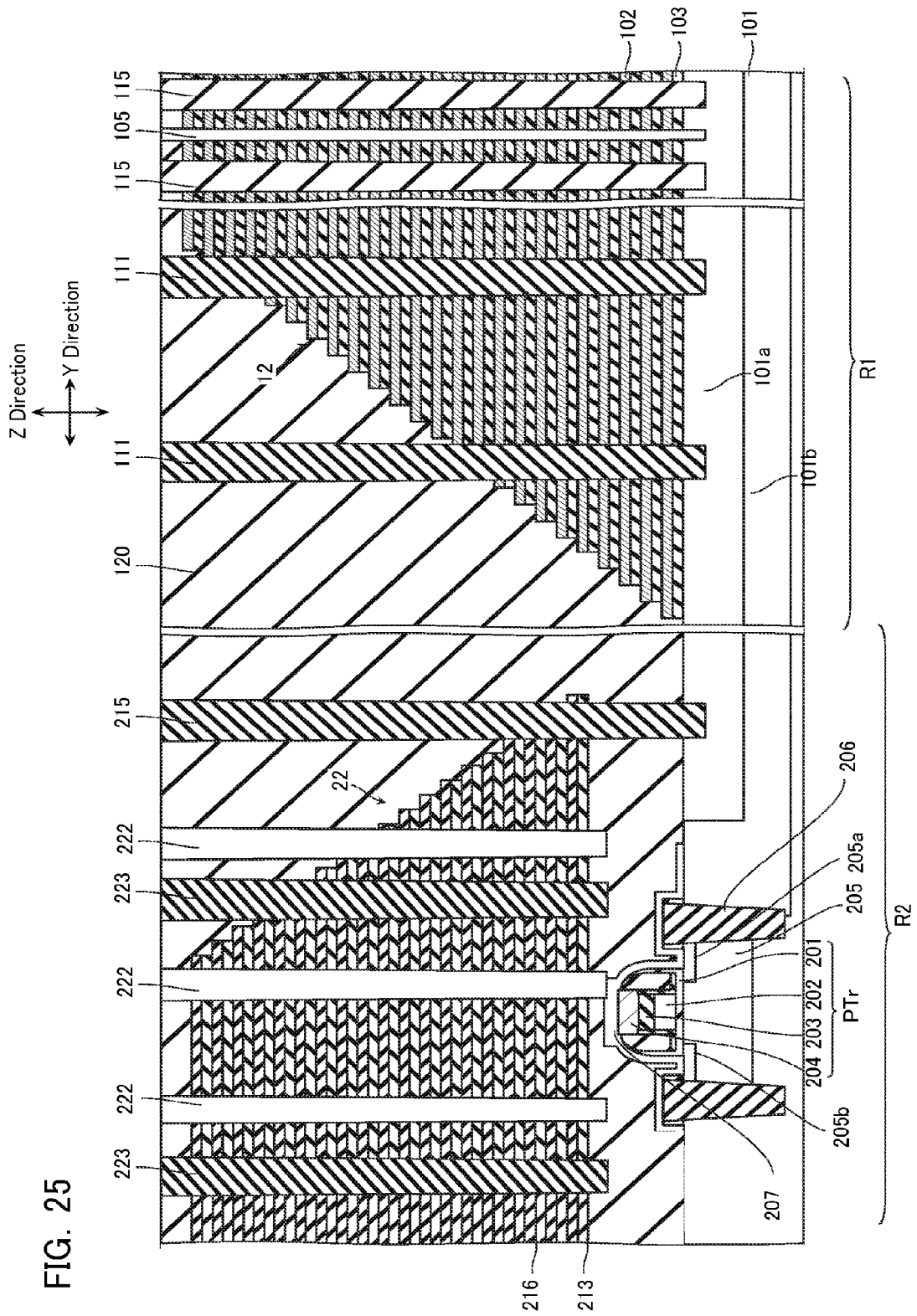

As shown in FIG. 25, in the peripheral circuit region R2, the plurality of holes 222 are formed. Formation of the hole 222 is performed employing half-etching. Therefore, the lower end of the hole 222 is disposed between the lowermost surface of the stepped portion 22 and the surface of the substrate 101, without reaching the surface of the substrate 101.

Figure 26:
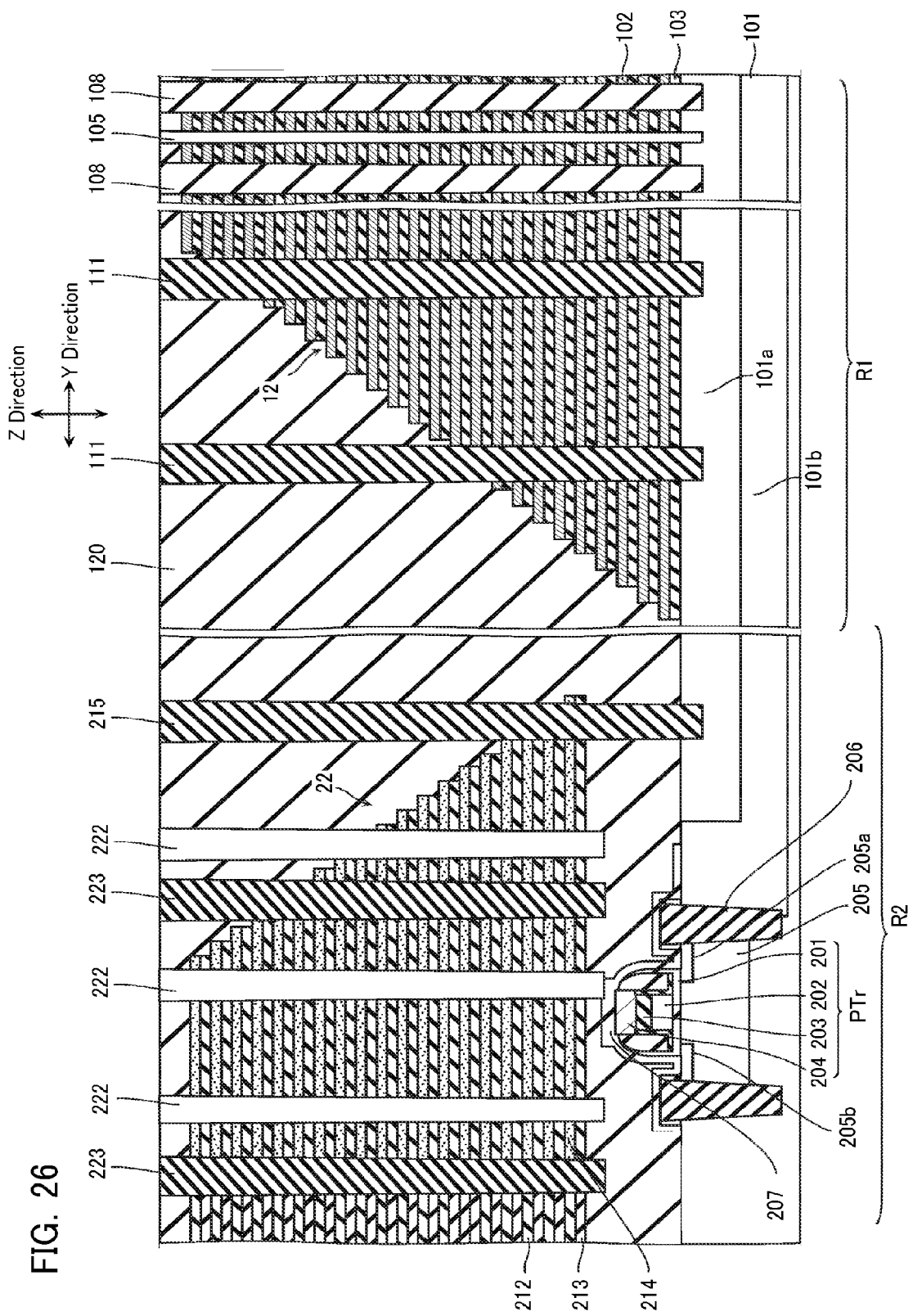

As shown in FIG. 26, the sacrifice layer 216 close to positions where the contacts 208, 209, 210, and 211 are formed, is replaced by the insulating layer 214, via the hole 222 formed by half-etching.

Subsequently, the contact holes 217, 218, 219, and 220 are formed. A conductive layer is deposited in the slit 114 and contact holes 217, 218, 219, and 220, and the configuration of FIG. 22 is obtained.

Similar advantages to those of the above-described embodiments are obtained also by the present embodiment. Moreover, the replacement-dedicated hole 222 is employed during replacement of the sacrifice layer 216 in the peripheral circuit region R2, without the contact holes 217, 218, 219, and 220 whose arrangement positions are limited, being employed. Therefore, replacement can be performed at a desired position, hence a degree of difficulty of a manufacturing step can be reduced.

Sixth Embodiment

Finally, a semiconductor memory device according to a sixth embodiment will be described using FIG. 27.

Figure 27:
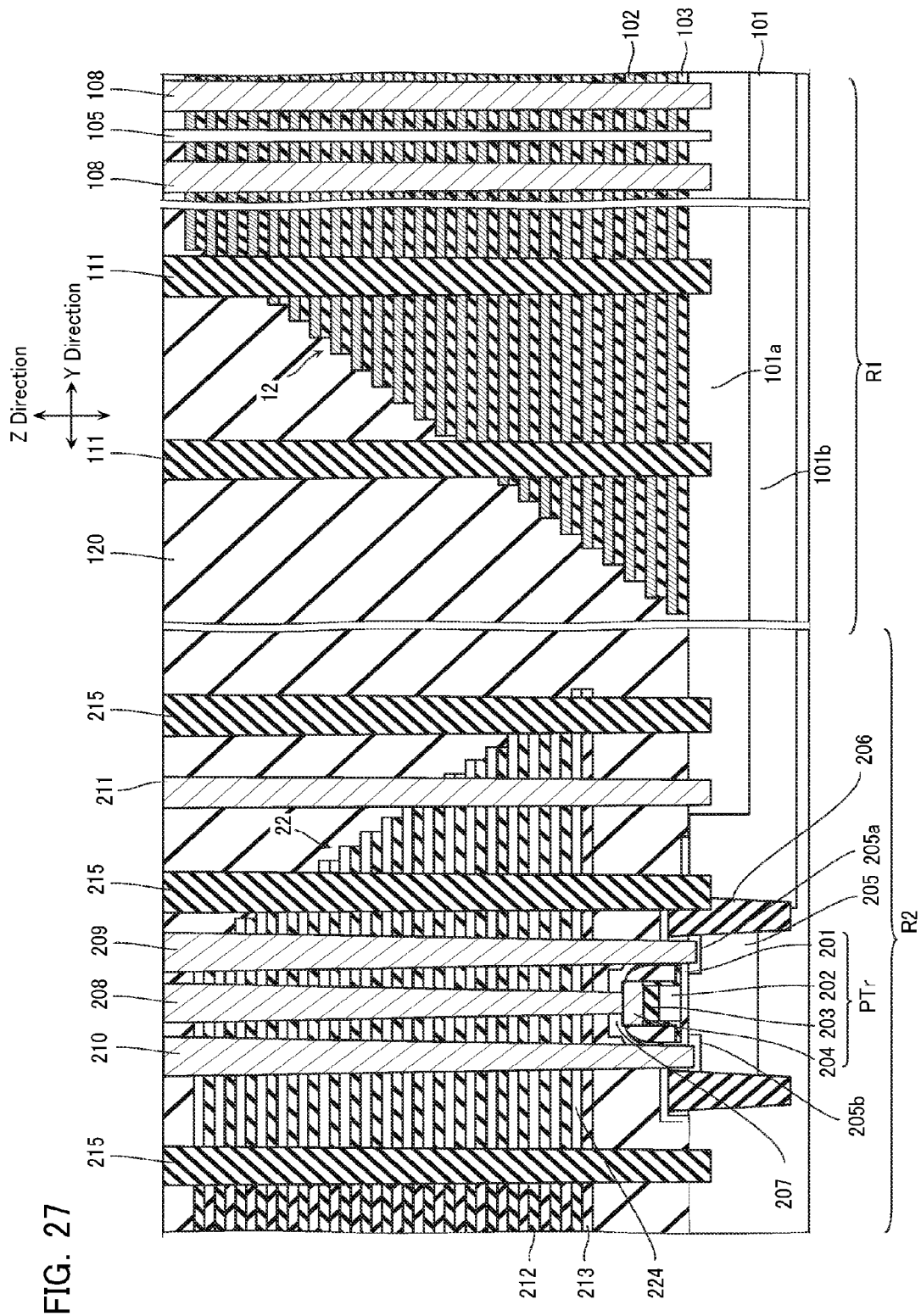
FIG. 27 is a schematic cross-sectional view showing a configuration of a semiconductor memory device according to a sixth embodiment.

As shown in FIG. 27, the semiconductor memory device according to the sixth embodiment has an air-filled gap 224 disposed between the plurality of stacked insulating layers 213 close to the contacts 208, 209, 210, and 211 of the peripheral circuit region R2.

This configuration makes it possible for air whose permittivity is low to be employed as an inter-layer insulating layer in the peripheral circuit region R2, and enables further suppression of parasitic capacitance.

In order to manufacture the semiconductor memory device according to the sixth embodiment, it is only required that in a step for replacing part of the sacrifice layer 216 by the insulating layer 214 in the peripheral circuit region R2 (for example, the step described using FIGS. 14 to 16 in the first embodiment), the insulating layer 214 is not deposited after part of the sacrifice layer 216 has been removed.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate;
   a memory cell array region including a plurality of conductive layers connected to memory cells arranged in a stacking direction on the semiconductor substrate, the plurality of conductive layers having a first stepped structure;
   a peripheral region including a transistor on the semiconductor substrate;
   a plurality of first layers and second layers stacked alternately in the stacking direction, above the transistor; and
   a plurality of first contacts penetrating the plurality of first and second layers and connected to the transistor,
   wherein a first layer of the plurality of first layers includes a different material than a second layer of the plurality of second layers, and
   the second layer includes a first portion disposed between the plurality of first contacts and a second portion that includes a different material from that of the first portion and is disposed in a portion other than between the plurality of first contacts.

2. The semiconductor memory device according to claim 1, wherein
   a material configuring the first portion includes a material having a lower permittivity than a material configuring the second portion.

3. The semiconductor memory device according to claim 1, wherein
   the first portion is an air-filled gap.

4. The semiconductor memory device according to claim 1, wherein
   more cavities exist in the first portion than in the second portion and the first layer.

5. The semiconductor memory device according to claim 1, further comprising
   a support penetrating the plurality of first layers and second layers,
   wherein a lower end of the support is positioned between a lowermost surface of the plurality of first layers and second layers and a surface of the semiconductor substrate.

6. The semiconductor memory device according to claim 1, further comprising
   a through hole penetrating the plurality of first layers and second layers, in the peripheral region,
   wherein a lower end of the through hole is positioned between a lowermost surface of the plurality of first layers and second layers and a surface of the semiconductor substrate.

7. The semiconductor memory device according to claim 1, wherein
   a second contact connected to the semiconductor substrate is further disposed close to an end of the peripheral region, and
   the first portion of the second layer is positioned between a first contact of the plurality of first contacts and the second contact.

8. The semiconductor memory device according to claim 1, wherein
   the plurality of first layers and second layers have a second stepped structure.

9. The semiconductor memory device according to claim 1, wherein
   the transistor is disposed in a periphery of the memory cell array region.

* * * * *